US012733542B2

(12) United States Patent
Song et al.

(10) Patent No.: US 12,733,542 B2
(45) Date of Patent: Sep. 8, 2026

(54) THREE-DIMENSIONAL (3D) INTEGRATED CIRCUIT (IC) (3DIC) PACKAGE EMPLOYING A REDISTRIBUTION LAYER (RDL) INTERPOSER FACILITATING SEMICONDUCTOR DIE STACKING, AND RELATED FABRICATION METHODS

(71) Applicant: QUALCOMM Incorporated, San Diego, CA (US)

(72) Inventors: Stanley Seungchul Song, San Diego, CA (US); Jonghae Kim, San Diego, CA (US); Je-Hsiung Lan, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 780 days.

(21) Appl. No.: 17/657,760

(22) Filed: Apr. 4, 2022

(65) Prior Publication Data

US 2023/0317677 A1 Oct. 5, 2023

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/023* (2026.01); *H10W 20/20* (2026.01);
(Continued)

(58) Field of Classification Search
CPC ............... H01L 23/481; H01L 23/5384; H01L 23/5386; H01L 23/5389
See application file for complete search history.

(56) References Cited

U.S. PATENT DOCUMENTS

2020/0381397 A1* 12/2020 Yu ........................... H01L 24/08
2021/0057352 A1 2/2021 Agarwal et al.
(Continued)

OTHER PUBLICATIONS

International Search Report and Written Opinion for International Patent Application No. PCT/US2023/015820, mailed Jul. 18, 2023, 11 pages.

*Primary Examiner* — Trang Q Tran
(74) *Attorney, Agent, or Firm* — Withrow & Terranova, PLLC

(57) ABSTRACT

Three-dimensional (3D) integrated circuit (IC) (3DIC) package employing a redistribution layer (RDL) interposer facilitating semiconductor die ("die"), and related fabrication methods. The 3DIC package includes an RDL interposer that has one or more RDL metallization layers formed adjacent to a first, bottom die(s). A second, top die(s) is stacked on the RDL interposer. The RDL interposer provides an extended die area that the top die can be coupled so that the fabrication process of the 3DIC package is independent die sizes. The bottom die(s) can be singulated and disposed in an RDL metallization layer(s) as part of a reconstituted RDL interposer regardless of whether the top die(s) is greater than or less than the size of the bottom die(s). Also, the RDL interposer being the substrate in which the bottom die(s) is disposed and top die(s) is coupled provides efficient signal routing paths to the top and bottom dies.

17 Claims, 16 Drawing Sheets

(51) Int. Cl.

| | |
|---|---|
| ***H10W 20/20*** | (2026.01) |
| ***H10W 70/05*** | (2026.01) |
| ***H10W 70/09*** | (2026.01) |
| ***H10W 70/60*** | (2026.01) |
| ***H10W 70/63*** | (2026.01) |
| ***H10W 70/65*** | (2026.01) |
| *H10W 70/652* | (2026.01) |
| *H10W 90/20* | (2026.01) |

(52) U.S. Cl.

CPC ........... *H10W 70/05* (2026.01); *H10W 70/09* (2026.01); *H10W 70/093* (2026.01); *H10W 70/611* (2026.01); *H10W 70/614* (2026.01); *H10W 70/635* (2026.01); *H10W 70/65* (2026.01); *H10W 70/6528* (2026.01); *H10W 90/271* (2026.01); *H10W 90/297* (2026.01)

(56) References Cited

U.S. PATENT DOCUMENTS

| | | | | |
|---|---|---|---|---|
| 2021/0407979 | A1 | 12/2021 | We et al. | |
| 2022/0367364 | A1* | 11/2022 | Jeon | H01L 23/5386 |
| 2023/0307341 | A1* | 9/2023 | Brun | H01L 21/486 |

* cited by examiner

3DIC PACKAGE 800
410(1)
406(1)
216(2)
224
230(1)
228(1)
218(1)
230(2)
724
TOP DIE 206
228(2)
228(3)
230(3)
226
216(2)
406(2)
410(2)
212
408
214(3)
210
804
219
214
216(3)
218(3)
216(2)
232(3)
218(2)
802
232(2)
204(2)
232(1)
216(3)
RDL INTERPOSER 402
217
PCB 222

1100G
1136
1138
1104
1128
1138
1128
1134
1138
1126
1108
1125
1120
1118
1120

Z
X
Y
1100H
1136
1134
1140
1108
1125
1122
1142
1104
1122
1142
1122

Z
X
Y
1000
FROM FIG. 10C
1014
COUPLE TOP DIE (1134) TO FIRST RDL METALLIZATION LAYER (1108) TO COUPLE TOP DIE (1108) TO RDL INTERPOSER (1125)
1016
FORM OVERMOLD LAYER (1140) ON TOP DIE (1134) AND FIRST RDL METALLIZATION LAYER (1108)

THREE-DIMENSIONAL (3D) INTEGRATED CIRCUIT (IC) (3DIC) PACKAGE EMPLOYING A REDISTRIBUTION LAYER (RDL) INTERPOSER FACILITATING SEMICONDUCTOR DIE STACKING, AND RELATED FABRICATION METHODS

BACKGROUND

I. Field of the Disclosure

The field of the disclosure relates to integrated circuit (IC) packages, and more particularly to three-dimensional (3D) IC packages that include multiple stacked semiconductor dies.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that is mounted on and electrically coupled to a package substrate to provide physical support and an electrical interface to the die(s). The package substrate includes one or more metallization layers that include electrical traces (e.g., metal lines) with vias coupling the electrical traces together between adjacent metallization layers to provide electrical interfaces between the die(s). The die(s) is electrically interfaced to metal interconnects exposed in a top or outer layer of the package substrate to electrically couple the semiconductor die(s) to the electrical traces of the package substrate. The package substrate includes an outer metallization layer coupled to external metal interconnects (e.g., solder bumps) to provide an external interface between the die(s) in the IC package for mounting the IC package on a circuit board to interface the die(s) with other circuitry.

Some IC packages are known as "hybrid" IC packages which include multiple dies for different purposes or applications. For example, a hybrid IC package may include a modem die as part of a front-end circuitry for supporting a communications interface. The hybrid IC package could also include one or more memory dies that provide memory to support data storage and access by the modem die, such as for buffering and outgoing data to be modulated and/or demodulated data. Thus, in these hybrid IC packages, it is conventional to stack the multiple dies on top of each other in a second, vertical direction in the IC package as a three-dimensional (3D) stack to provide a 3DIC package to conserve area consumed by the IC die package in the first, horizontal directions. In a 3DIC package, the bottom-most die that is directly adjacent to the package substrate of the IC package is electrically coupled through die interconnects to metal interconnects in an upper metallization layer of the package substrate. Other stacked dies that are not directly adjacent to the package substrate of the IC package are also coupled to the package substrate. For example, other stack dies can be electrically coupled by wire bonds to the package substrate, or coupled by through-silicon vias (TSVs) that extend through an intermediate die layer(s) and/or bottom die layer to the package substrate. External connections to the dies are formed through electrical connections in the package substrate. Also, die-to-die (D2D) connections between the stacked dies are formed through electrical connections in the package substrate.

A 3DIC package can be a bottom-greater-than-top (BGT) die configuration, or a top-greater-than-bottom (TGB) die configuration. In a BGT 3DIC package, a bottom die is greater in length in a horizontal direction than a top die stacked on the bottom die. In a TGB 3DIC package, the top die is greater in length in a horizontal direction than a bottom die in which the top die is stacked. Fabrication processes differ for a BGT 3DIC package and TGB 3DIC package, because in each process, the smaller die is fabricated separately and bonded to a wafer in which the larger die is formed. In a BGT 3DIC package, a top die that has been previously fabricated and diced into chip form in a separate fabrication process, is bonded to the bottom wafer in a top chip-to-bottom wafer bonding process. The stacked top die and bottom wafer with its bottom die can then be diced. An overmold material does not have to be employed to fill in gaps that would otherwise be present if the top die was greater in length than the bottom die. However, in a TGB 3DIC package, a bottom chip-to-top wafer bonding process is employed, because the top die is larger in length than the bottom die. In a TGB 3DIC package, a bottom die that has been previously fabricated and diced into chip form in a separate fabrication process, is bonded to a top wafer in a bottom chip-to-top wafer bonding process.

SUMMARY OF THE DISCLOSURE

Aspects disclosed herein include a three-dimensional (3D) integrated circuit (IC) (3DIC) package employing a redistribution layer (RDL) interposer facilitating semiconductor die ("die") stacking. Related fabrication methods are also disclosed. In exemplary aspects, the 3DIC package includes an RDL interposer that has one or more RDL metallization layers formed adjacent to a first, bottom die(s). The redistribution metallization layer(s) in the RDL interposer is a metallization layer(s) that includes metal interconnects (e.g., metal lines, metal traces) that provide fan-out connections (e.g., metal pads) from die interconnects of the first, bottom die and/or second, top die to other locations in the 3DIC package for signal routing. The 3DIC package also includes a second, top die(s) that is stacked on the RDL interposer in a vertical direction in a 3D stacked die arrangement. The redistribution metallization layer(s) in the RDL interposer is a metallization layer(s) that includes metal interconnects (e.g., metal lines, metal traces) that provide fan-out connections (e.g., metal pads) from die interconnects of the first, bottom die and/or second, top die to other locations in the 3DIC package for signal routing. Also, by integrating the first, bottom die in the RDL interposer, the RDL interposer provides an extended die area in which the top die can be coupled to the RDL interposer and/or the first, bottom die to provide the 3DIC package. In this manner, as an example, the fabrication process of the stacked top and bottom dies in the 3DIC package can be independent of whether the top die is greater than the bottom die in a top die-greater-than bottom die (TGB) configuration, or the bottom die is greater than the top die in a bottom die-greater-than top die (BGT) configuration. The bottom die(s) can be singulated and disposed on a formed RDL metallization layer(s) as part of a reconstituted RDL interposer. The top die can then be coupled to the RDL interposer regardless of whether the 3DIC package will be in a TGB or BGT configuration. In conventional 3DIC package fabrication processes, the smaller die is fabricated and singulated in a separate process and then bonded to a wafer in which the larger die is formed. The use of the RDL interposer to facilitate the 3D die stacking in the 3DIC package can be independent of further packaging, such as performing an external bumping process to couple the 3DIC package to a package substrate for example.

Also, the RDL interposer in the 3DIC package being the substrate in which the bottom die(s) is disposed and in which the top die is coupled provides efficient signal routing paths to the top and bottom dies. In one example, the bottom die is coupled to metal interconnects in a redistribution metallization layer(s) in the RDL interposer to provide a signal routing path between the bottom die and external interconnects (e.g., ball grid array (BGA) interconnects) of the 3DIC package. The external interconnects may be directly coupled to the RDL interposer and/or an RDL metallization layer in the 3DIC package. In another example, the top die is coupled to metal interconnects in an outer redistribution metallization layer of the RDL interposer as a result of coupling the top die to the RDL interposer, to provide a signal routing path(s) between the top die and external interconnects of the 3DIC package. Also, in another example, the top die is coupled to through-silicon-vias (TSVs) extending through the bottom die to provide a signal routing path(s) between the top die and the RDL interposer. Also, with the bottom die being disposed in the RDL interposer, the top die can be aligned in a vertical direction with and coupled to the bottom die to provide die-to-die (D2D) interconnections between the top and bottom dies. Other dies can also be coupled to the RDL interposer outside of the bottom die(s), wherein signal routing paths are provided in the RDL interposer between such other dies and the top and/or bottom dies.

In this regard, in one exemplary aspect, an IC package is provided. The IC package includes an interposer. The interposer comprises a first surface and a second surface opposing the first surface. The interposer also comprises one or more RDL metallization layers between the first surface and the second surface. The IC package also includes a first die disposed in the interposer. The first die comprises a first die interconnect coupled to a first metal interconnect in a first RDL metallization layer of the one or more RDL metallization layers, and a second die coupled to the first surface of the interposer. The second die comprising a second die interconnect coupled to the first RDL metallization layer.

In another exemplary aspect, a method of fabricating an IC package is provided. The method comprises forming an interposer comprising forming a first RDL metallization layer adjacent to a first die the first RDL metallization layer comprising a first surface and a second surface opposing the first surface, and coupling a first die interconnect of the first die to a first metal interconnect in the first RDL metallization layer. The method also comprises coupling a second die to the first surface of the interposer. The method also comprises coupling a second die interconnect of the second die to the first RDL metallization layer.

DETAILED DESCRIPTION

Figure 1:
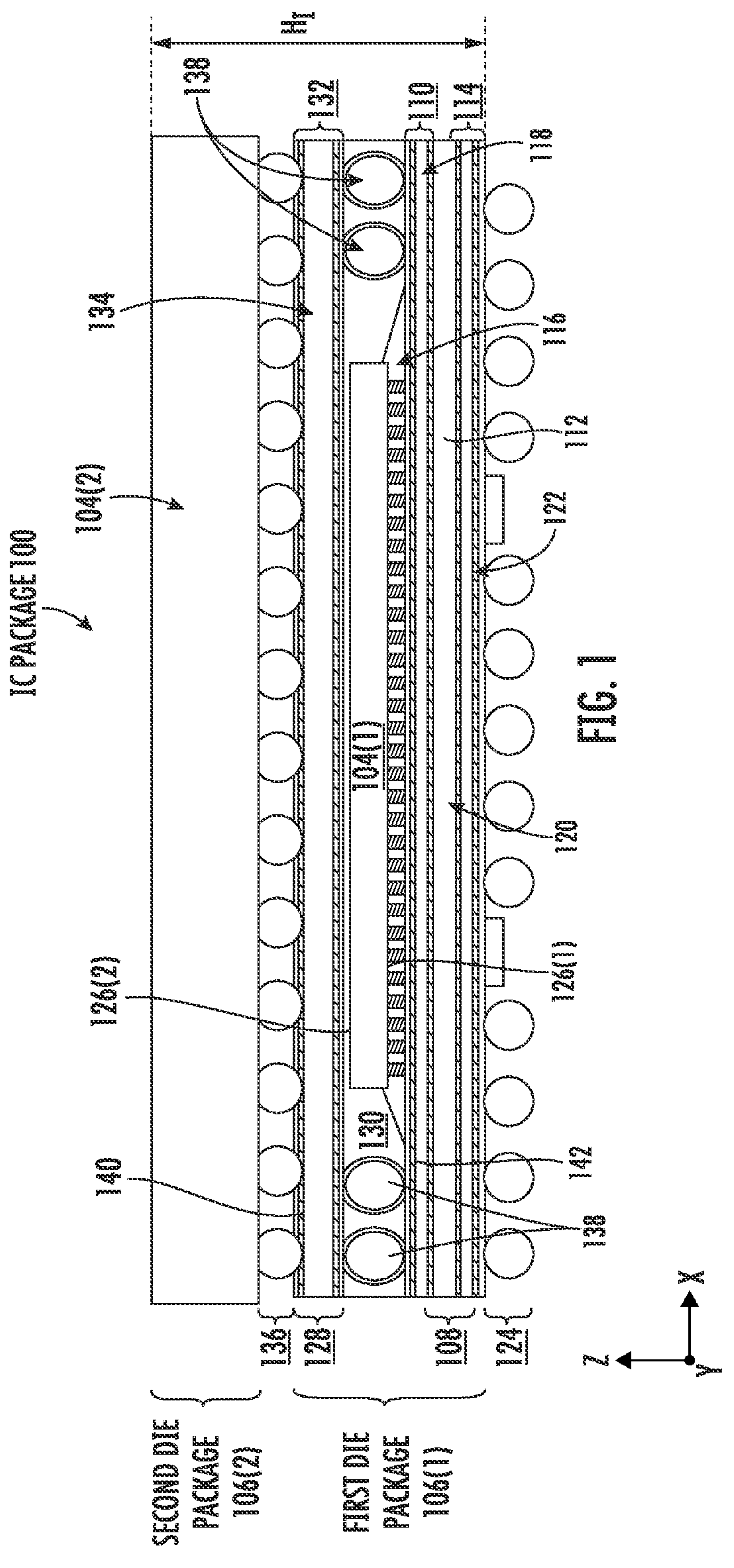
FIG. 1 is a side view of a three-dimensional (3D) integrated circuit (IC) (3DIC) package that includes a semiconductor die ("die") that includes a top die in a top die package coupled to a bottom die in a bottom die package.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a three-dimensional (3D) integrated circuit (IC) (3DIC) package employing a redistribution layer (RDL) interposer facilitating semiconductor die ("die") stacking. Related fabrication methods are also disclosed. In exemplary aspects, the 3DIC package includes an RDL interposer that has one or more RDL metallization layers formed adjacent to a first, bottom die(s). The 3DIC package also includes a second, top die(s) that is stacked on the RDL interposer in a vertical direction in a 3D stacked die arrangement. The redistribution metallization layer(s) in the RDL interposer is a metallization layer(s) that includes metal interconnects (e.g., metal lines, metal traces) that provide fan-out connections (e.g., metal pads) from die interconnects of the first, bottom die and/or second, top die to other locations in the 3DIC package for signal routing. Also, by integrating the first, bottom die in the RDL interposer, the RDL interposer provides an extended die area in which the top die can be coupled to the RDL interposer and/or the first, bottom die to provide the 3DIC package. In this manner, as an example, the fabrication process of the stacked top and bottom dies in the 3DIC package can be independent of whether the top die is greater than the bottom die in a top die-greater-than bottom die (TGB) configuration, or the bottom die is greater than the top die in a bottom die-greater-than top die (BGT) configuration. The bottom die(s) can be singulated and disposed on a formed RDL metallization layer(s) as part of a reconstituted RDL interposer. The top die can then be coupled to the RDL interposer regardless of whether the 3DIC package will be in a TGB or BGT configuration. In conventional 3DIC package fabrication processes, the smaller die is fabricated and singulated in a separate process and then bonded to a wafer in which the larger die is formed. The use of the RDL interposer to facilitate the 3D die stacking in the 3DIC package can be independent of further packaging, such as performing an external bumping process to couple the 3DIC package to a package substrate for example.

The RDL interposer in the 3DIC package being the substrate in which the bottom die(s) is disposed and in which the top die is coupled provides efficient signal routing paths to the top and bottom dies. In one example, the bottom die is coupled to metal interconnects in a redistribution metallization layer(s) in the RDL interposer to provide a signal routing path between the bottom die and external interconnects (e.g., ball grid array (BGA) interconnects) of the 3DIC package. The external interconnects may be directly coupled to the RDL interposer and/or an RDL metallization layer in the 3DIC package. In another example, the top die is coupled to metal interconnects in an outer redistribution metallization layer of the RDL interposer as a result of coupling the top die to the RDL interposer, to provide a signal routing path(s) between the top die and external interconnects of the 3DIC package. Also, in another example, the top die is coupled to through-silicon-vias (TSVs) extending through the bottom die to provide a signal routing path(s) between the top die and the RDL interposer. Also, with the bottom die being disposed in the RDL interposer, the top die can be aligned in a vertical direction with and coupled to the bottom die to provide die-to-die (D2D) interconnections between the top and bottom dies. Other dies can also be coupled to the RDL interposer outside of the bottom die(s), wherein signal routing paths are provided in the RDL interposer between such other dies and the top and/or bottom dies.

Figure 2A:
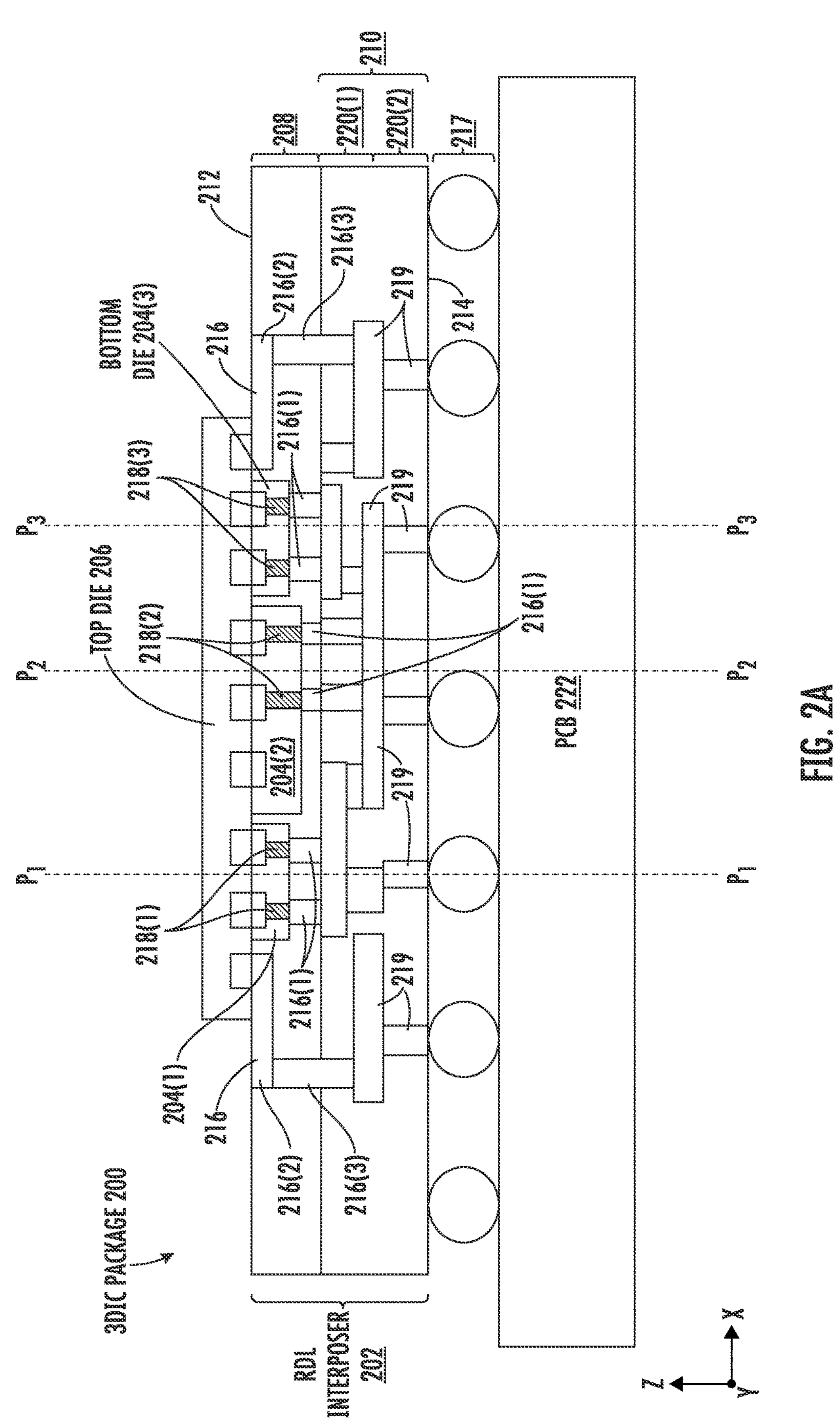
FIGS. 2A and 2B are side views of an exemplary 3DIC package in a bottom die-greater-than top die (BGT) configuration, wherein the 3DIC package includes a reconstituted redistribution layer (RDL) interposer that facilitates an extended die area for 3D stacking of a top die to bottom dies and also includes one or more RDL metallization layers for providing signal routing paths for the top and/or bottom dies.

Before discussing examples of 3DIC packages that include an RDL interposer that facilitates an extended die area for 3D stacking of a top die(s) to bottom die(s) and also includes one or more RDL metallization layers for providing signal routing paths for the top and/or bottom dies starting at FIG. 2A, an exemplary top-greater-than-bottom (TGB) three-dimensional (3D) integrated circuit (IC) (3DIC) package 100 (also referred to as "3DIC package 100") that does not include the RDL interposer is first described with regard to FIG. 1.

In this regard, FIG. 1 is a side view of an exemplary IC package 100. The IC package 100 is a 3D stacked-die IC package 102 that includes multiple dies 104(1), 104(2) that are included in respective die packages 106(1), 106(2) that are stacked on top of each other in the vertical direction (Z-axis direction). The first die package 106(1) of the IC package 100 includes the die 104(1) coupled to a package substrate 108. In this example, the package substrate 108 includes first, upper metallization layers 110 disposed on a core substrate 112, which is also referred to herein as a "metallization layer 110." The core substrate 112 is disposed on second, bottom metallization layers 114. The upper metallization layers 110 provide an electrical interface for signal routing to the die 104(1). The die 104(1) is coupled to die interconnects 116 (e.g., raised metal bumps) that are electrically coupled to metal interconnects 118 in the upper metallization layers 110. The metal interconnects 118 in the upper metallization layers 110 are coupled to metal interconnects 120 in the core substrate 112, which are coupled to metal interconnects 122 in the bottom metallization layers 114. In this manner, the package substrate 108 provides interconnections between its metallization layers 110, 114, and core substrate 112 to provide signal routing to the die 104(1). External interconnects 124 (e.g., ball grid array (BGA) interconnects) are coupled to the metal interconnects 122 in the bottom metallization layers 114 to provide interconnections through the package substrate 108 to the die 104(1) through the die interconnects 116. In this example, a first, active side 126(1) of the first die 104(1) is adjacent to and coupled to the package substrate 108, and more specifically the upper metallization layers 110 of the package substrate 108.

In the example IC package 100 in FIG. 1, to provide a 3D stacking of dies, a second die package 106(2) is provided and coupled to the first die package 106(1) to support multiple dies. For example, the first die 104(1) in the first die package 106(1) may include an application processor, and the second die 104(1) may be a memory die, such as a dynamic random access memory (DRAM) die that provides memory support for the application processor. In this regard, in this example, the first die package 106(1) also includes an interposer substrate 128 that is disposed on a package mold 130 encasing the first die 104(1), adjacent to a second, inactive side 126(2) of the first die 104(1). The interposer substrate 128 also includes one or more metallization layers 132 that each includes metal interconnects 134 to provide interconnections to the second die 104(2) in the second die package 106(2). The second die package 106(2) is physically and electrically coupled to the first die package 106(1) by being coupled through external interconnects 136 (e.g., solder bumps, BGA interconnects) to the interposer substrate 128. The external interconnects 136 are coupled to the metal interconnects 134 in the interposer substrate 128.

To provide interconnections to route signals from the second die 104(2) through the external interconnects 136 and the interposer substrate 128 to the first die 104(1), vertical interconnects 138 (e.g., metal pillars, metal posts, metal vertical interconnect accesses (vias), such as through-mold vias (TMVs)) are disposed in the package mold 130 of the first die package 106(1). The vertical interconnects 138 extend from a first, bottom surface 140 of the interposer substrate 128 to a first, top surface 142 of the package substrate 108 in the vertical direction (Z-axis direction) in this example. The vertical interconnects 138 are coupled to the metal interconnects 134 in the interposer substrate 128 adjacent bottom surface 140 of the interposer substrate 128. The vertical interconnects 138 are also coupled to the metal interconnects 118 in the upper metallization layers 110 of the package substrate 108 adjacent to the top surface 142 of the package substrate 108. In this manner, the vertical interconnects 138 provide a bridge for interconnections, such as input/output (I/O) connections, between the interposer substrate 128 and the package substrate 108. This provides signal routing paths between the second die 104(2) in the second die package 106(1), and the first die 104(1) and external interconnects 124 through the package substrate.

Thus, as shown in FIG. 1, in the IC package 100, the stacking of the second die 104(2) above the first die 104(1) is accomplished by disposing the first and second dies 104(1), 104(2) in their own respective first and second die packages 106(1), 106(2). The external interconnects 136 are formed for the second die package 106(2) to provide electrical signal routing paths through the interposer substrate 128 to the first die package 106(1). The vertical interconnects 138 are provided in the first die package 106(1) to provide signal routing paths to the second die 104(2). Thus, in the IC package 100 in FIG. 1, the die stacking that is accomplished by forming and stacking separate die packages 106(1), 106(2) that are coupled together through the external interconnects 138, interposer substrate 128, and vertical interconnects 138. The external interconnects 138, interposer substrate 128, and vertical interconnects 138 contributes to an overall height $H_1$ of IC package 100. It may be desired to minimize the height of a 3D stacked IC package, such as IC package 100. Also, it may be desired to simplify the fabrication of the IC package 100 such that the formation of separate die packages 106(1), 106(2) and interposer substrate 128 is not required to provide the first and second dies 104(1), 104(2) in a 3D stacked arrangement in an IC package.

Figure 2B:
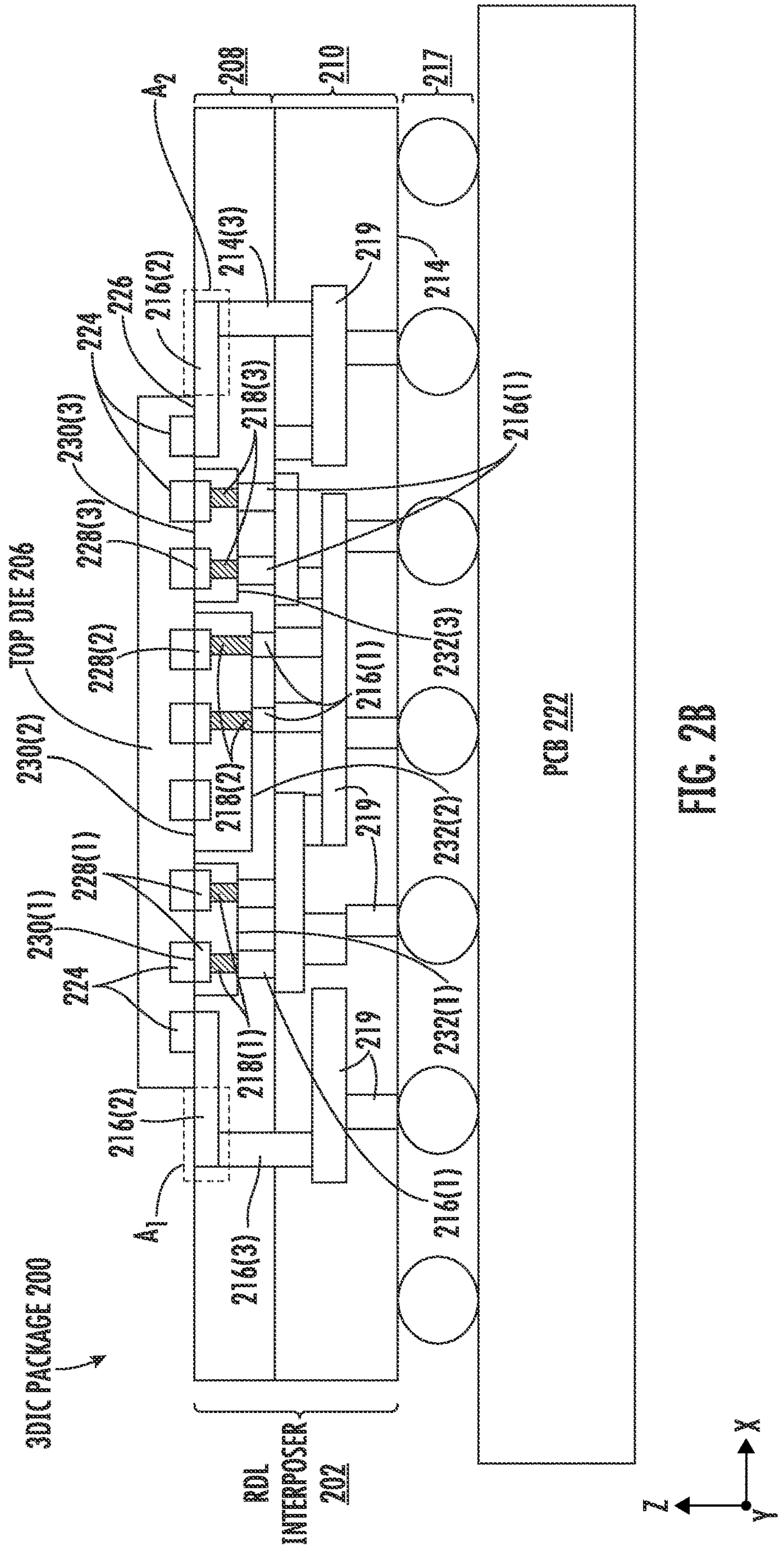

FIGS. 2A and 2B are side views of an exemplary 3DIC package 200 that includes a reconstituted interposer 202 to facilitate the 3D stacking of dies in a vertical direction (Z-axis direction) and to provide signal routing to the dies in an efficient manner. The interposer 202 is a RDL interposer 202 in this example in that the interposer 202 includes one or more RDL metallization layers. The interposer 202 is also referred to herein as "RDL interposer 202." An RDL interposer, such as the RDL interposer 202 in FIGS. 2A and 2B, includes one or more RDL metallization layers that include metal interconnects (e.g., metal lines, metal traces) that can provide fan-out connections (e.g., metal pads) for one part of an IC package to another location in the IC package for signal routing to provide better access to such connections. The RDL metallization layer includes an additional metal layer of wiring metal interconnects that redistribute (i.e., re-route) connection access to different parts of an IC package, including for example outside the area of where die connected in the package, to make it easier to provide smaller (e.g., higher line/space (L/S) density) die interconnects (e.g., microbumps) for connection of a die. The 3DIC package 200 in FIG. 2A is configured in a bottom die-greater-than top die (BGT) configuration in this example. As shown in FIG. 2A, the 3DIC package 200 includes a plurality of first, bottom dies 204(1)-204(3). The 3DIC package 200 also includes a second, top die 206 stacked above the bottom dies 204(1)-204(3) in the vertical direction (Z-axis direction). The bottom dies 204(1)-204(3) are integrated into the RDL interposer 202 as a reconstituted RDL interposer to facilitate the 3D stacking of the top die 206 above the bottom dies 204(1)-204(3) in the 3DIC package 200 in a height efficient manner while also providing an effective manner in which to provide signal routing for the top die 206 and the bottom dies 204(1)-204(3). The top die 206 shares common vertical planes $P_1$, $P_2$, $P_3$ with the respective bottom dies 204(1)-204(3). The RDL interposer 202 extends in a horizontal direction (X-axis and Y-axis directions). By integrating the bottom dies 204(1)-204(3) in the RDL interposer 202, the bottom dies 204(1)-204(3) do not have to be formed in separate die packages that are then bumped with external interconnects to connect the bottom dies 204(1)-204(3) in a 3DIC package. The RDL interposer 202 also provides an extended die area in the horizontal directions (X-axis and Y-axis directions) for the top die 206 to be coupled. The top die 206 is coupled to (e.g., stacked on) a first, top surface 212 of the RDL interposer 202 that opposes a second, outer surface 214 of the RDL interposer 202 in a vertical direction (Z-axis direction) orthogonal to horizontal directions (X-axis and Y-axis directions) in a 3D stacked die arrangement as part of the 3DIC package 200. AN RDL metallization layer 208 of the RDL interposer 202 is disposed between the first and second surfaces 212, 214. In this manner, the RDL interposer 202 provides a structure for the top die 206 to be stacked above the bottom dies 204(1)-204(3) in a 3D stacked arrangement, so that the 3DIC package 200 can be fabricated using the same process, whether in a BGT configuration (as shown in FIG. 2A) or a TGB configuration.

In this manner, by integrating the first, bottom dies 204(1)-204(3) in the RDL interposer 202, the RDL interposer 202 provides an extended die area in which the top die 206 can be coupled to the RDL interposer 202. In this manner, as an example, the fabrication process of fabricating the 3DIC package 200 can be independent of whether the top die 206 is greater than the bottom dies 204(1)-204(3) in area in the horizontal directions (X-axis and Y-axis directions) in a TGB configuration, or the bottom dies 204(1)-204(3) are greater in area in the horizontal directions (X-axis and Y-axis directions) than the top die 206 in a BGT configuration. The bottom dies 204(1)-204(3) can be singulated and disposed in or adjacent to the RDL metallization layer 208 as part of a reconstituted RDL interposer 202. The top die 206 can then be coupled to the RDL interposer 202 regardless of whether the 3DIC package 200 will be in a TGB or BGT configuration. In conventional 3DIC package fabrication processes, the smaller die is fabricated and singulated in a separate process and then bonded to a wafer in which the larger die is formed. The use of the RDL interposer to facilitate the 3D die stacking in the 3DIC package can be independent of further packaging, such as performing an external bumping process to couple the 3DIC package to a package substrate for example.

Also, with continued reference to FIG. 2A, the RDL interposer 202 in the 3DIC package 200 being the substrate in which the bottom dies 204(1)-204(3) are disposed and in which the top die 206 is coupled provides efficient signal routing paths to the bottom dies 204(1)-204(3) and top die 206. The RDL interposer 202 provides a metallization structure that provides signal routing for the bottom dies 204(1)-204(3) and the top die 206 within the 3DIC package 200. In this example, the RDL interposer 202 includes the first RDL metallization layer 208 that is formed on an interposer substrate 210 (e.g., a silicon interposer substrate). The interposer substrate 210 can also be an RDL metallization layer. The RDL metallization layer 208 is a metallization layer that includes metal interconnects 216 (e.g., metal lines, metal traces) that provide signal routing paths for the bottom dies 204(1)-204(3) and top die 206 in the RDL interposer 202. The bottom dies 204(1)-204(3) are disposed adjacent to the RDL metallization layer 208 in the RDL interposer 202 to integrate the bottom dies 204(1)-204(3) in the RDL interposer 202.

In this example, the bottom dies 204(1)-204(3) are coupled to metal interconnects 216(1) in the first RDL metallization layer 208 to provide a signal routing path between the bottom dies 204(1)-204(3) and external interconnects 217 (e.g., solder balls) of the 3DIC package 200. In this example, the top die 206 is coupled to metal interconnects 216(2) that are fanned out in an area outside of the top die 206 in the RDL metallization layer 208 of the RDL interposer 202 as a result of coupling the top die 206 to the first, outer surface 212 of the RDL interposer 202. This provides signal routing paths between the top die 206 and the external interconnects 217 of the 3DIC package 200. Also in this example, as shown in FIG. 2A, the top die 206 is coupled to respective through-silicon-vias (TSVs) 218(1)-218(3) extending through the bottom dies 204(1)-204(3) to provide a signal routing paths between the top die 206 and the RDL interposer 202. Also, with the bottom dies 204(1)-204(3) being disposed in the RDL interposer 202, the top die 206 is shown as being aligned in a vertical direction (Z-axis direction) with and coupled to the bottom dies 204(1)-204(3) to provide die-to-die (D2D) interconnections between the top die 206 and the bottom dies 204(1)-204(3). Also, as shown in FIG. 2A, with any of the signal routing examples discussed above, signals can be further routed to the interposer substrate 210 through metal interconnects 216(3) (e.g., through-mold-vias (TMVs)) that are coupled to metal interconnects 219 formed in one or more metallization layers 220(1)-220(2) of the interposer substrate 210. The metallization layers 220(1)-220(2) may also be RDL metallization layers. Thus, the signals can be routed through the metal interconnects 219 of the interposer substrate 210 to the external interconnects 217, which are coupled to a printed circuit board (PCB) 222 in this example.

FIG. 2B is another side view that illustrates the 3DIC package 200 to discuss additional exemplary detail. As shown in FIG. 2B, to couple the top die 206 to the RDL interposer 202, the top die 206 has die interconnects 224 (e.g., die pads) exposed through an active face 226 of the top die 206. The die interconnects 224 are coupled to the RDL interposer 202 to provide signal routing between the top die 206 and the RDL interposer 202 and/or to the bottom dies 204(1)-204(3). The die interconnects 224 of the top die 206 can be coupled to metal interconnects 216(2) in the RDL metallization layer 208 that are fanned out in areas $A_1$, $A_2$ outside the top die 206 in the horizontal direction (X-axis and Y-axis direction) to provide a signal routing path(s) to the RDL interposer 202. The bottom dies 204(1)-204(3) also each have respective die interconnects 228(1)-228(3) (e.g., die pads) that are exposed through respective active faces 230(1)-230(3) in this example. The top die 206 can be directly coupled to a bottom die 204(1)-204(3) by coupling a respective die interconnect 224 of the top die 206 to a die interconnect 228(1)-228(3) of a bottom die 204(1)-204(3), such as through hybrid bonding, compression bonding, or use of microbumps as examples. Note that in an alternative arrangement, the bottom dies 204(1)-204(3) could be disposed in the RDL interposer 202 in a flipped configuration from that shown in FIG. 2B, such that their respective back side, inactive faces 232(1)-232(2) are adjacent to and facing the active face 226 of the top die 206.

Also in this example, to also provide signal routing paths from the top die 206 to the RDL interposer 202 below the bottom dies 204(1)-204(3) and that bypass the bottom dies 204(1)-204(3), vias 218(1)-218(3) (e.g., through-silicon vias (TSVs)) can be disposed through the respective bottom dies 204(1)-204(3) and coupled to die interconnects 224 of the top die 206. The vias 218(1)-218(3) are routed to respective metal interconnects 216(2) in the RDL metallization layer 208, that are coupled to metal interconnects 219 in the interposer substrate 210.

Thus, as shown in FIGS. 2A and 2B, the RDL interposer 202 in the 3DIC package 200 provides a metallization structure that can be provide efficient signal routing for the top die 206 and the bottom dies 204(1)-204(3) as well as provide a structure in which the top die 206 can be stacked. In this manner, the 3DIC package 200 provides an efficient stacked die arrangement. Other stacked die arrangements are also possible that employ an RDL interposer, like the RDL interposer 202 in FIGS. 2A and 2B, to facilitate efficient signal routing for between stacked dies as well as provide a structure in which a top die can be stacked.

Figure 3:
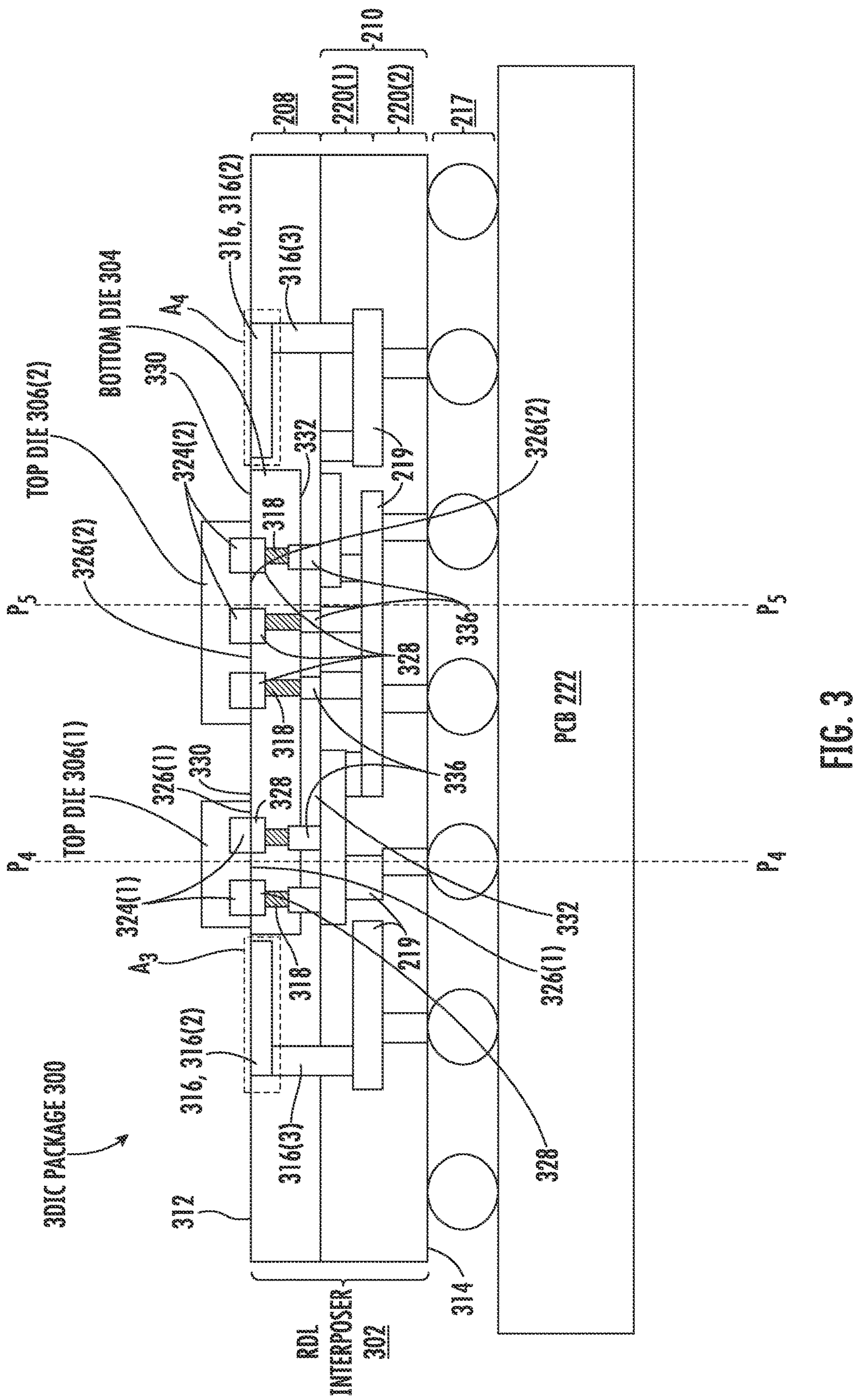
FIG. 3 is a side view of another exemplary 3DIC package in a top die-greater-than bottom die (TGB) configuration, wherein the 3DIC package includes an RDL interposer that facilitates an extended die area for 3D stacking of top dies to a bottom die and also includes one or more RDL metallization layers for providing signal routing paths for the top and/or bottom dies.

In this regard, FIG. 3 is a side view of another exemplary 3DIC package 300 that also includes a reconstituted interposer 302 to facilitate the 3D stacking of a dies in a vertical direction (Z-axis direction) and to provide signal routing to the dies in an efficient manner. The interposer 302 is a RDL interposer 302 in this example in that the interposer includes one or more RDL metallization layers. The interposer 302 is also referred to herein as "RDL interposer 302." The 3DIC package 300 in FIG. 3 is configured in a TGB configuration in this example. As shown in FIG. 3, the 3DIC package 300 includes a bottom die 304. The 3DIC package 300 also includes a plurality of second, top dies 306(1), 306(2) stacked above the bottom die 304 in the vertical direction (Z-axis direction). The bottom die 304 is integrated into the RDL interposer 302 as a reconstituted RDL interposer in this example to facilitate the 3D stacking of the top dies 306(1), 306(2) above the bottom die 304 in the 3DIC package 300 in a height efficient manner while also providing an effective manner in which to provide signal routing for the top dies 306(1), 306(2) and the bottom die 304. The top dies 306(1), 306(2) share common vertical planes $P_4$, $P_5$ with the bottom die 304. The RDL interposer 302 extends in a horizontal direction (X-axis and Y-axis directions). By integrating the bottom die 304 in the RDL interposer 302, the bottom die 304 does not have to be formed in a separate die package that is then bumped with external interconnects to connect the bottom die 304 in a 3DIC package. The RDL interposer 302 also provides an extended die area in the horizontal directions (X-axis and Y-axis directions) where the top dies 306(1), 306(2) are coupled. The top dies 306(1), 306(2) are coupled to (e.g., stacked on) a first, top surface 312 of the RDL interposer 302 that opposes a second, outer surface 314 of the RDL interposer 302 in a vertical direction (Z-axis direction) orthogonal to horizontal directions (X-axis and Y-axis directions) in a 3D stacked die arrangement as part of the 3DIC package 300. AN RDL metallization layer 308 of the RDL interposer 302 is disposed between the first and second surfaces 312, 314. In this manner, the RDL interposer 302 provides a structure for the top die 206 to be stacked above the bottom dies 204(1)-204(3) in a 3D stacked arrangement, so that the 3DIC package 300 can be fabricated using the same process, whether in a BGT configuration (as shown in FIG. 2A) or a TGB configuration.

In this manner, by integrating the first, bottom die 304 in the RDL interposer 302, the RDL interposer 302 provides an extended die area in which the top dies 306(1), 306(2) can be coupled to the RDL interposer 302. In this manner, as an example, the fabrication process of fabricating the 3DIC package 300 can be independent of whether the top dies 306(1), 306(2) are greater than the bottom die 304 in area in the horizontal directions (X-axis and Y-axis directions) in a TGB configuration, or the bottom die 304 is greater in area in the horizontal directions (X-axis and Y-axis directions) than the top dies 306(1), 306(2) in a BGT configuration as shown in FIG. 3. The bottom die 304 can be singulated and disposed in or adjacent to the RDL metallization layer 308 as part of a reconstituted RDL interposer 302. The top dies 306(1), 306(2) can then be coupled to the RDL interposer 302 regardless of whether the 3DIC package 300 will be in a TGB or BGT configuration. In conventional 3DIC package fabrication processes, the smaller die is fabricated and singulated in a separate process and then bonded to a wafer in which the larger die is formed. The use of the RDL interposer to facilitate the 3D die stacking in the 3DIC package can be independent of further packaging, such as performing an external bumping process to couple the 3DIC package to a package substrate for example.

Also, with continued reference to FIG. 3, the RDL interposer 302 in the 3DIC package 300 being the substrate in which the bottom die 304 is disposed and in which the top dies 306(1), 306(2) are coupled provides efficient signal routing paths to the bottom die 304 and top dies 306(1), 306(2). The RDL interposer 302 provides a metallization structure that provides signal routing for the bottom die 304 and the top dies 306(1), 306(2) within the 3DIC package 300. In this example, the RDL interposer 302 includes the first RDL metallization layer 308 that is formed on an interposer substrate 210 like shown in the 3DIC package 200 in FIGS. 2A and 2B (e.g., a silicon interposer substrate). The RDL metallization layer 308 is a metallization layer that includes metal interconnects 316 (e.g., metal lines, metal traces) that provide signal routing paths for the bottom die 304 and top dies 306(1), 306(2) in the RDL interposer 302. The bottom die 304 is disposed adjacent to RDL metallization layer 308 in the RDL interposer 302 to integrate the bottom dies 304 in the RDL interposer 302.

In this example, the bottom die 304 is coupled to metal interconnects 316(1) in the first RDL metallization layer 308 to provide a signal routing path between the bottom die 304 and the external interconnects 217 of the 3DIC package 300. In this example, the top dies 306(1), 306(2) are coupled to metal interconnects 316(2) that are fanned out in an area outside of the top dies 306(1), 306(2) in the RDL metallization layer 308 of the RDL interposer 302 as a result of coupling the top dies 306(1), 306(2) to the first, outer surface 312 of the RDL interposer 302. This provides signal routing paths between the top dies 306(1), 306(2) and the external interconnects 317 of the 3DIC package 300. Also in this example, as shown in FIG. 3, the top dies 306(*l*), 306(2) are coupled to through-silicon-vias (TSVs) 318 extending through the bottom die 304 to provide signal routing paths between the top dies 306(1), 306(2) and the RDL interposer 302. Also, with the bottom die 304 being disposed in the RDL interposer 302, the top dies 306(1), 306(2) are shown as being aligned in a vertical direction (Z-axis direction) with and coupled to the bottom die 304 to provide die-to-die (D2D) interconnections between the top dies 306(1), 306(2) and the bottom die 304. Also, as shown in FIG. 3, with any of the signal routing examples discussed above, signals can be further routed to the interposer substrate 210 through metal interconnects 316(3) that are coupled to metal interconnects 219 formed in one or more metallization layers 220(1)-220(2) of the interposer substrate 210. Thus, the signals can be routed through the metal interconnects 219 of the interposer substrate 210 to the external interconnects 217, which are coupled to a printed circuit board (PCB) 222 in this example.

Also as shown in FIG. 3, to couple the top dies 306(1), 306(2) to the RDL interposer 302, the top dies 306(1), 306(2) have die interconnects 324(1), 324(2)(e.g., die pads) exposed through respective active face 326(1), 326(2) of the top dies 306(1), 306(2). The die interconnects 324(1), 324(2) are coupled to the RDL interposer 302 to provide signal routing between the top dies 306(1), 306(2) and the RDL interposer 302 and/or to the bottom die 304. The die interconnects 324(1), 324(2) of the top die 306 can be coupled to metal interconnects 316(2) in the RDL metallization layer 308 that are fanned out in areas $A_3$, $A_4$ outside the top dies 306(1), 306(2) in the horizontal direction (X-axis and Y-axis direction) to provide a signal routing path(s) to the RDL interposer 302. The bottom die 304 also has die interconnects 328 (e.g., die pads) that are exposed through an active face 330 of the bottom die 304 in this example. The top dies 306(1), 306(2) can be directly coupled to the bottom die 304 by coupling a respective die interconnects 324(1), 324(2) of the top dies 306(1), 306(2) to a die interconnect 328 of the bottom die 304, such as through hybrid bonding, compression bonding, or use of microbumps as examples. Note that in an alternative arrangement, the bottom die 304 could be disposed in the RDL interposer 302 in a flipped configuration from that shown in FIG. 3, such that its back side, inactive face 332 is adjacent to and face the active faces 326(1), 326(2) of the top dies 306(1), 306(2).

Also in this example, to also provide signal routing paths from the top dies 306(1), 306(2) to the RDL interposer 302 below the bottom die 304 and that bypass the bottom die 304, the vias 318 (e.g., through-silicon vias (TSVs)) can be disposed through the bottom die 304 and coupled to die interconnects 324(1), 324(2) of the top dies 306(1), 306(2). The vias 318 are routed to respective metal interconnects 316(1) in the RDL metallization layer 308, that are coupled to metal interconnects 219 in the interposer substrate 210.

Figure 4:
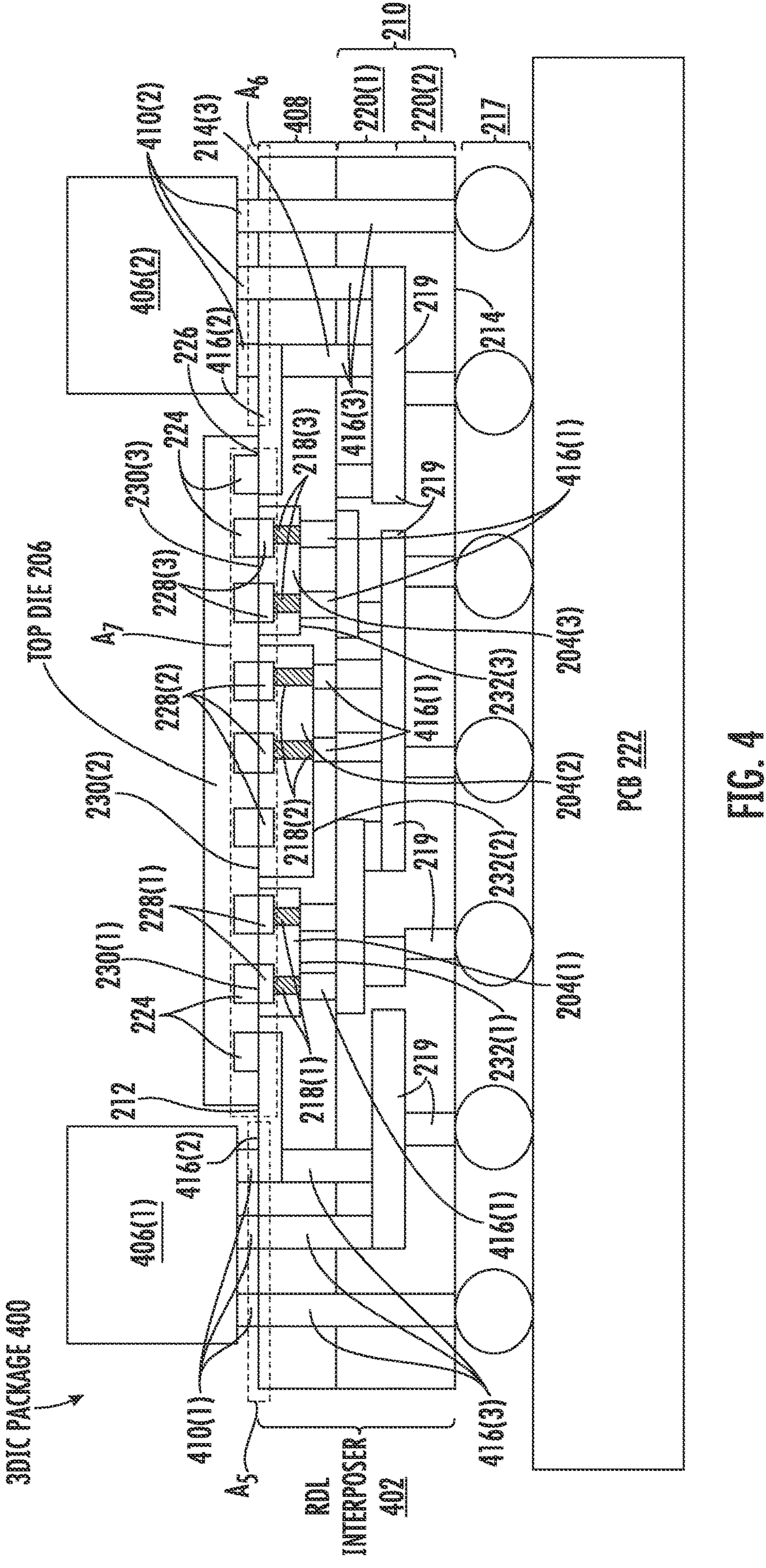
FIG. 4 is a side view of another exemplary 3DIC package similar to the 3DIC package in FIGS. 2A and 2B, and also includes additional dies coupled to the RDL interposer outside of the bottom dies in the RDL interposer.

FIG. 4 is a side view of another exemplary 3DIC package 400 similar to the 3DIC package 200 in FIGS. 2A and 2B. Common elements between the 3DIC package 400 in FIG. 4 and the 3DIC package 200 in FIGS. 2A and 2B are shown with common element numbers, and are not re-described. As shown in FIG. 4, the 3DIC package 300 includes additional dies 406(1), 406(2) that are coupled to an interposer 402. The interposer 402 is a RDL interposer 202 in this example in that the interposer 402 includes one or more RDL metallization layers. The interposer 402 is also referred to herein as "RDL interposer 402." The RDL interposer 402 is similar to the RDL interposer 202 in FIGS. 2A and 2B with common elements shown with common element numbers. The additional dies 406(1), 406(2) are coupled to the RDL interposer 402 in a 2.5 dimensional (2.5D) arrangement, wherein the additional dies 406(1), 406(2) are in respective areas $A_5$, $A_6$ outside the area $A_7$ of the top die in the horizontal direction (X-axis and Y-axis directions). Thus, in the 3DIC package 400 in FIG. 4, the RDL interposer 402 is also supporting the additional dies 406(1), 406(2). The RDL interposer 402 increasing the die area in which to couple dies provides additional area in this example to also incorporate and couple additional dies 406(1), 406(2) in the 3DIC package 400. For example, the additional dies 406(1), 406(2) may be memory dies. The RDL interposer 402 not only provides an area in which the additional dies 406(1), 406(2) can be coupled, but also provides an interposer for signal routing between the additional dies 406(1), 406(2) and the RDL interposer 402 similar to the top die 206.

In this example, to couple the additional dies 406(1), 406(2) to the RDL interposer 402, external metal interconnects 410(1), 410(2) (e.g., solder bumps, microbumps, die pads) coupled to the additional dies 406(1), 406(2), are coupled to the first, top surface 212 of the RDL interposer 402. The external metal interconnects 410(1), 410(2) are coupled to the RDL interposer 402 to provide signal routing between the additional dies 406(1), 406(2) and the RDL interposer 402 and/or to the bottom die 304 and/or top dies 206(1), 206(2). The external metal interconnects 410(1), 410(2) of the additional die 406(1), 406(2) can be coupled to metal interconnects 416(3) (e.g., TMVs) in the RDL metallization layer 408 that are fanned out in areas $A_5$, $A_6$ outside the area $A_7$ of top die 206 in the horizontal direction (X-axis and Y-axis direction) to provide a signal routing path(s) to the RDL interposer 402. The external metal interconnects 410(1), 410(2) can be coupled to the external interconnects 217, the bottom dies 204(1)-204(3) through other metal interconnects 416(1), 416(2), and/or the top die 206 through the vias 218(1)-218(3).

Thus, as shown in FIG. 4, the RDL interposer 402 in the 3DIC package 400 provides a metallization structure that can be provide efficient signal routing for the additional dies 406(1), 406(2) as well as provide a structure in which the additional dies 406(1), 406(2) can be stacked. In this manner, the 3DIC package 400 provides an efficient stacked die arrangement.

Figure 5:
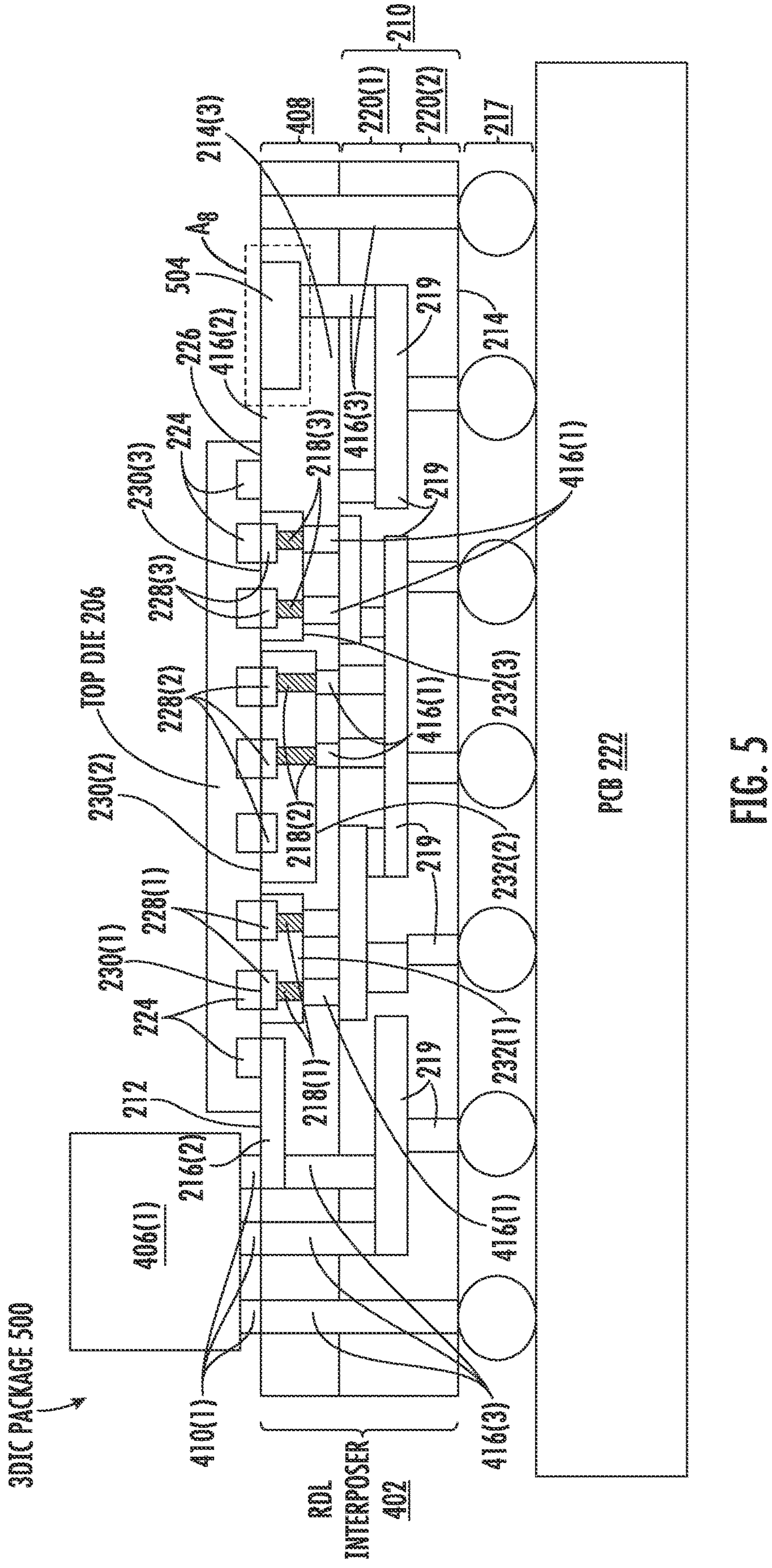
FIG. 5 is a side view of another exemplary 3DIC package similar to the 3DIC package in FIG. 4, and that includes an additional die coupled to the RDL interposer outside of the bottom dies in the RDL interposer and an interposer die disposed in the RDL interposer.

FIG. 5 is a side view of another exemplary 3DIC package 500 in a BGT configuration that is similar to the 3DIC package 400 in FIG. 4. Common elements between the 3DIC package 500 in FIG. 5 and the 3DIC package 400 in FIG. 4 are shown with common element numbers and will not be re-described. However, in the 3DIC package 500 in FIG. 5, instead of providing the additional die 406(2), another die 504 is provided in the area $A_8$ outside of the top die 206 and bottom dies 204(1)-204(3) in the horizontal directions (X-axis and Y-axis directions). The die 504 can be another functional die or chiplet that does not need to communicate with the top die 206 and therefore does not have to be aligned vertically to have a common plane with the top die 206. However, in this example, the die 504 is coupled to metal interconnects 216(3) in the RDL metallization layer 408 to provide signal routing between the die 504 and the RDL interposer 402.

Figure 6:
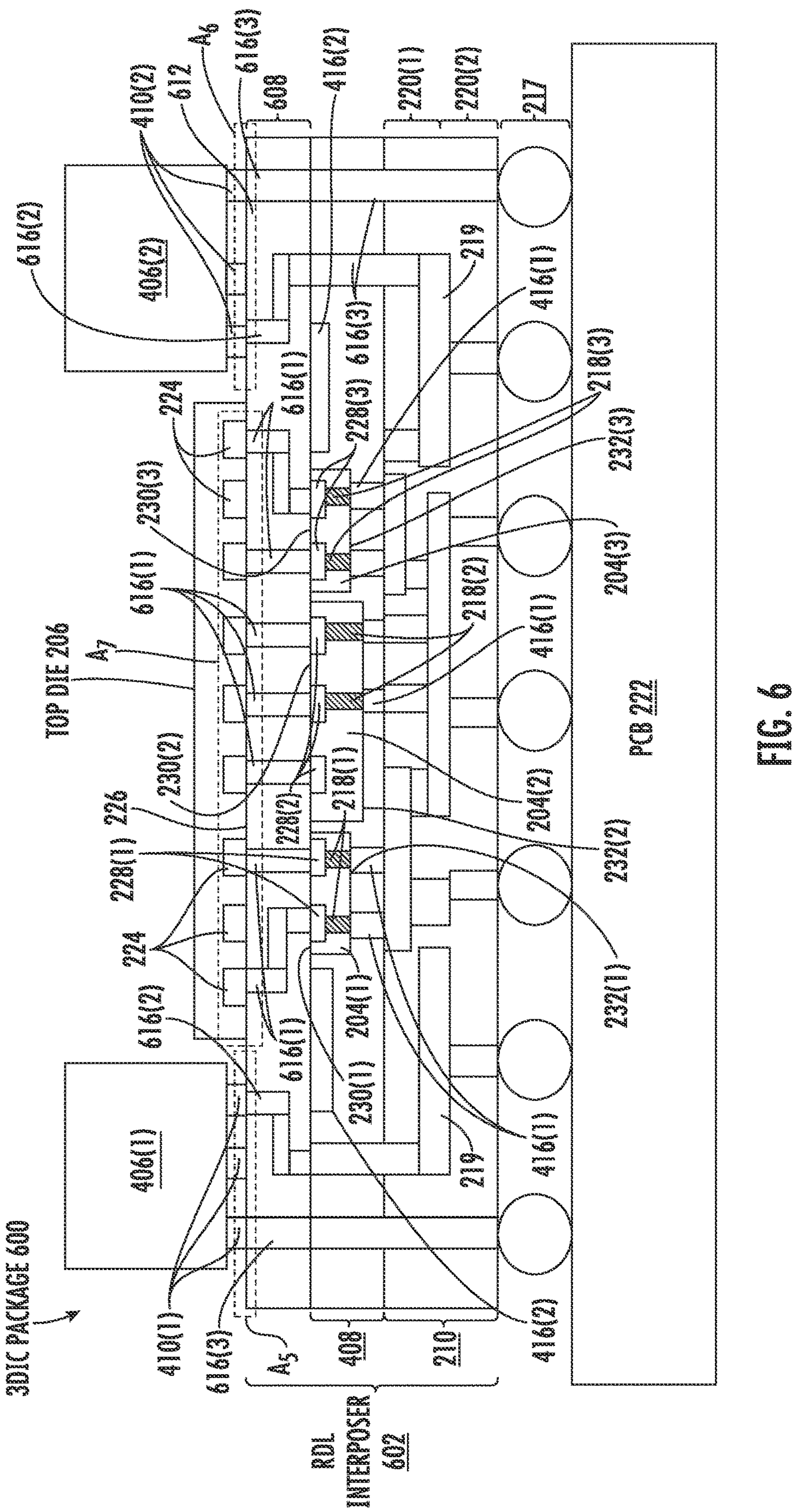
FIG. 6 is a side view of another exemplary 3DIC package in BGT configuration similar to the 3DIC package in FIG. 4, wherein the top die is coupled to an RDL interposer, that is coupled on a reconstituted RDL interposer that includes bottom dies.

FIG. 6 is a side view of another exemplary 3DIC package 600 in BGT configuration and that is similar to the 3DIC package 400 in FIG. 4. Common elements between the 3DIC package 600 in FIG. 6 and the 3DIC package 400 in FIG. 4 are shown with common element numbers and will not be re-described. However, in the 3DIC package 600 in FIG. 6, an interposer 602 is provided that includes the RDL metallization layer 408 in the 3DIC package 400 in FIG. 4. The interposer 602 is a RDL interposer 602 in this example in that the interposer 602 includes one or more RDL metallization layers. The interposer 602 is also referred to herein as "RDL interposer 602." However, the RDL interposer 602 in FIG. 6 includes an additional RDL metallization layer 608 that is disposed between the top dies 206(1)-206(3) and the bottom dies 204(1)-204(3) in a vertical direction (Z-axis direction). The bottom dies 204(1)-204(3) are disposed in the RDL metallization layer 408, but the RDL metallization layer 408 is separated from the top dies 204(1)-204(3) through the intermediate RDL metallization layer 608. Providing an additional RDL metallization layer 608 may provide increased routing capability and/or flexibility in the 3DIC package 600.

As shown in FIG. 6, to couple the top die 206 to the RDL interposer 602, the die interconnects 224 (e.g., die pads) exposed through the active face 226 of the top die 206 are coupled to a top surface 612 of the RDL interposer 602. The coupling of the die interconnects 224 to the RDL interposer 602 provides signal routing between the top die 206 and the RDL interposer 602 and/or to the bottom dies 204(1)-204(3). The die interconnects 224 of the top die 206 are coupled to metal interconnects 616(1) in the RDL metallization layer 608 to provide a signal routing path(s) to the RDL interposer 602. The metal interconnects 616(1) in the RDL interposer 602 can be routed to the bottom dies 204(1)-204(3) or other metal interconnects 616(2), 616(3) in the RDL interposer 602 to route signals to the additional dies 406(1), 406(2), the bottom dies 204(1)-204(3), and/or the external interconnects 217. The bottom dies 204(1)-204(3) also each have respective die interconnects 228(1)-228(3)(e.g., die pads) that can be coupled to metal interconnects 616(1) in the RDL metallization layer 608 to provide signal routing paths to the top die 204. Also in this example, to also provide signal routing paths from the top die 206 to the RDL interposer 602 below the bottom dies 204(1)-204(3), metal interconnects 616(1) that are coupled to die interconnects 224 of the top die 206 can be coupled to vias 218(1)-218(3) disposed through the respective bottom dies 204(1)-204(3) similar to as described previously in the 3DIC package 200 in FIGS. 2A and 2B. The vias 218(1)-218(3) are routed to respective metal interconnects 216(2) in the RDL metallization layer 208, that are coupled to metal interconnects 219 in the interposer substrate 210. Metal interconnects 616(2), 616(3) (e.g., TMVs) are also disposed through the RDL metallization layer 608 to provide connections between the additional dies 406(1), 406(2) and the RDL interposer 602.

Figure 7:
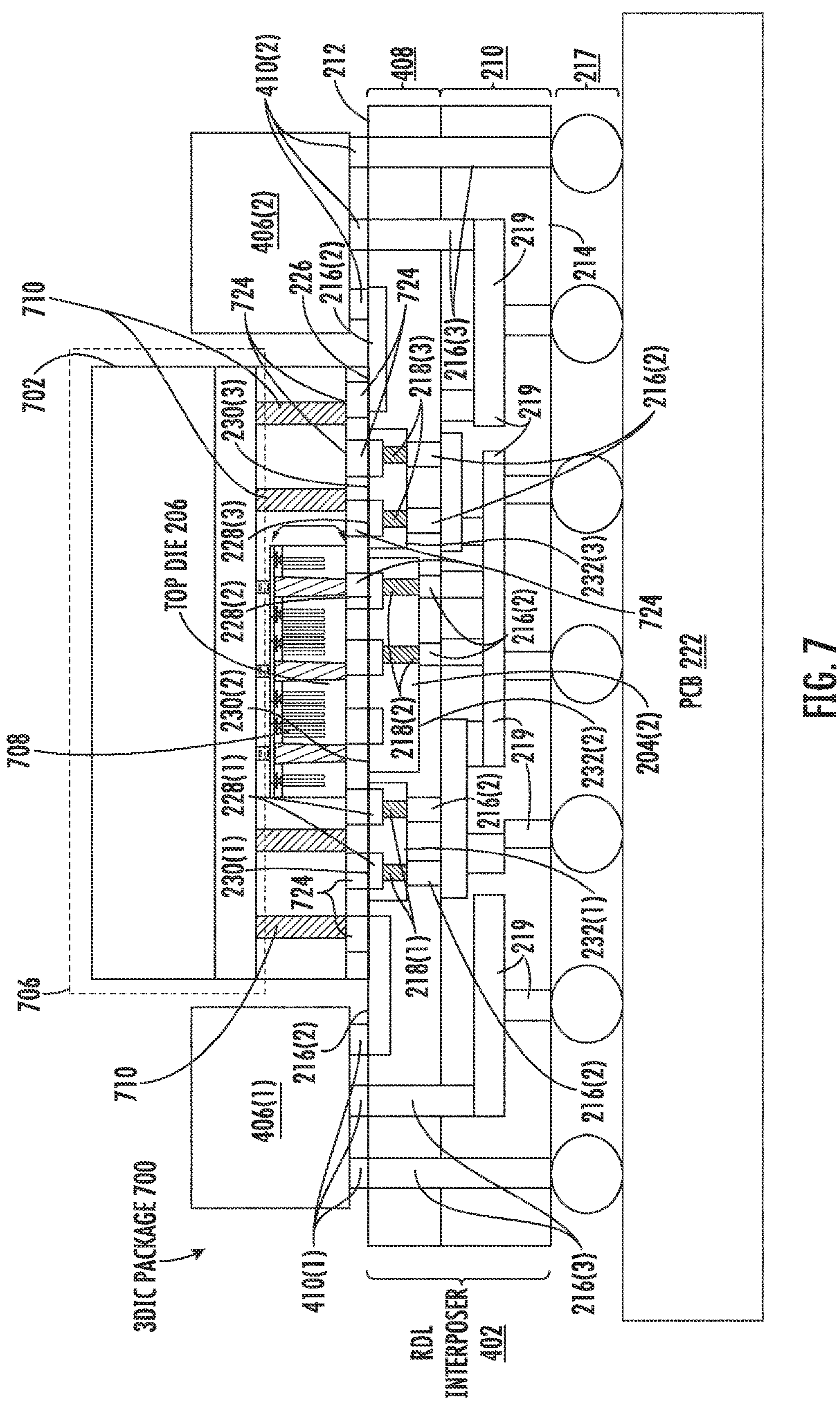
FIG. 7 is a side view of another exemplary 3DIC package similar to the 3DIC package in FIG. 4, wherein the top die is integrated into a chiplet that includes an integrated decoupling capacitor coupled to the RDL interposer.

FIG. 7 is a side view of another exemplary 3DIC package 700 that similar to the 3DIC package 400 in FIG. 4. Common elements between the 3DIC package 700 in FIG. 7 and the 3DIC package 400 in FIG. 4 are shown with common element numbers and will not be re-described. As shown in FIG. 7, a top die 706 is integrated in a chiplet 702 that is coupled to the RDL interposer 408. The chiplet 702 includes an integrated decoupling capacitor 708 that provides a decoupling capacitance between the RDL interposer 402 and the top die 706. The top die 706 is stacked above the decoupling capacitor 708 in the chiplet 702 in the vertical direction (Z-axis direction). Metal interconnects 724 of the chiplet 702 are coupled to the RDL interposer 402 to provide signal routing between the decoupling capacitor 708 and the top die 706 to the RDL interposer 402, similar to the die interconnects 224 of the top die 206 in the 3DIC package 400 in FIG. 4. To provide signal routing between the top die 706 and the RDL interposer 408, the chiplet 702 includes vias 710 that extend vertically through the chiplet 702 are coupled to the top die 706.

Figure 8:
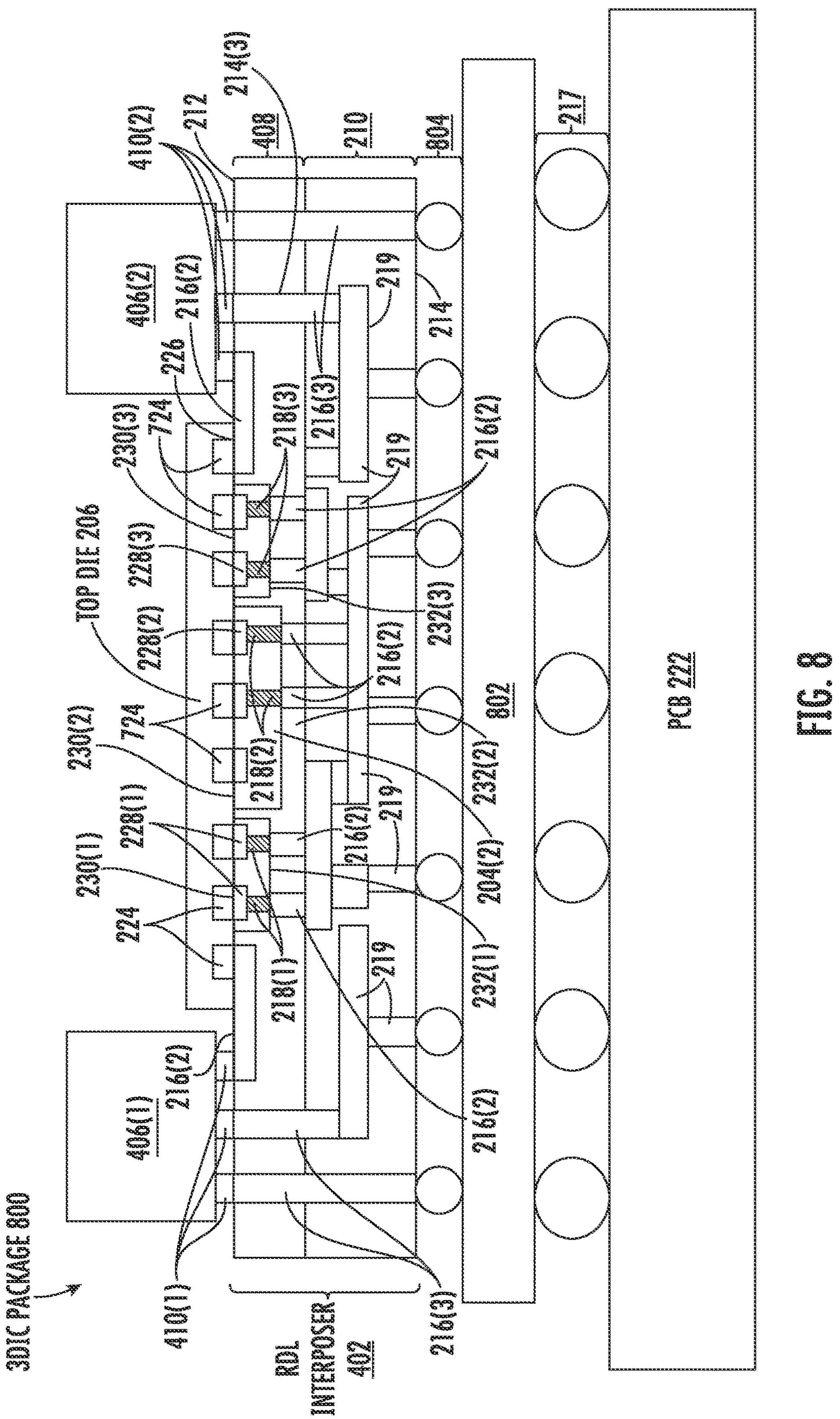
FIG. 8 is a side view of the 3DIC package in FIG. 4, and whose external interconnects are coupled to a package substrate.

A 3DIC package like described in the examples above can also be provided as part of another IC package that includes a package substrate to provide additional signal routing options. In this regard, FIG. 8 is a side view of the 3DIC package 400 in FIG. 4. Common elements between the 3DIC package 800 in FIG. 8 and the 3DIC package 400 in FIG. 4 are shown with common elements numbers and will not be re-described. However, as shown in FIG. 8, the 3DIC package 400 is not coupled directly to the PCB 222 but rather is coupled to a package substrate 802. The package substrate 802 includes one or more metallization layers that have metal interconnects for providing of signals. The 3DIC package 400 is coupled to the package substrate 802 through external interconnects 804 that are BGA interconnects in this example. The package substrate 802 is coupled to the PCB 222 through the external interconnects 217.

Figure 9:
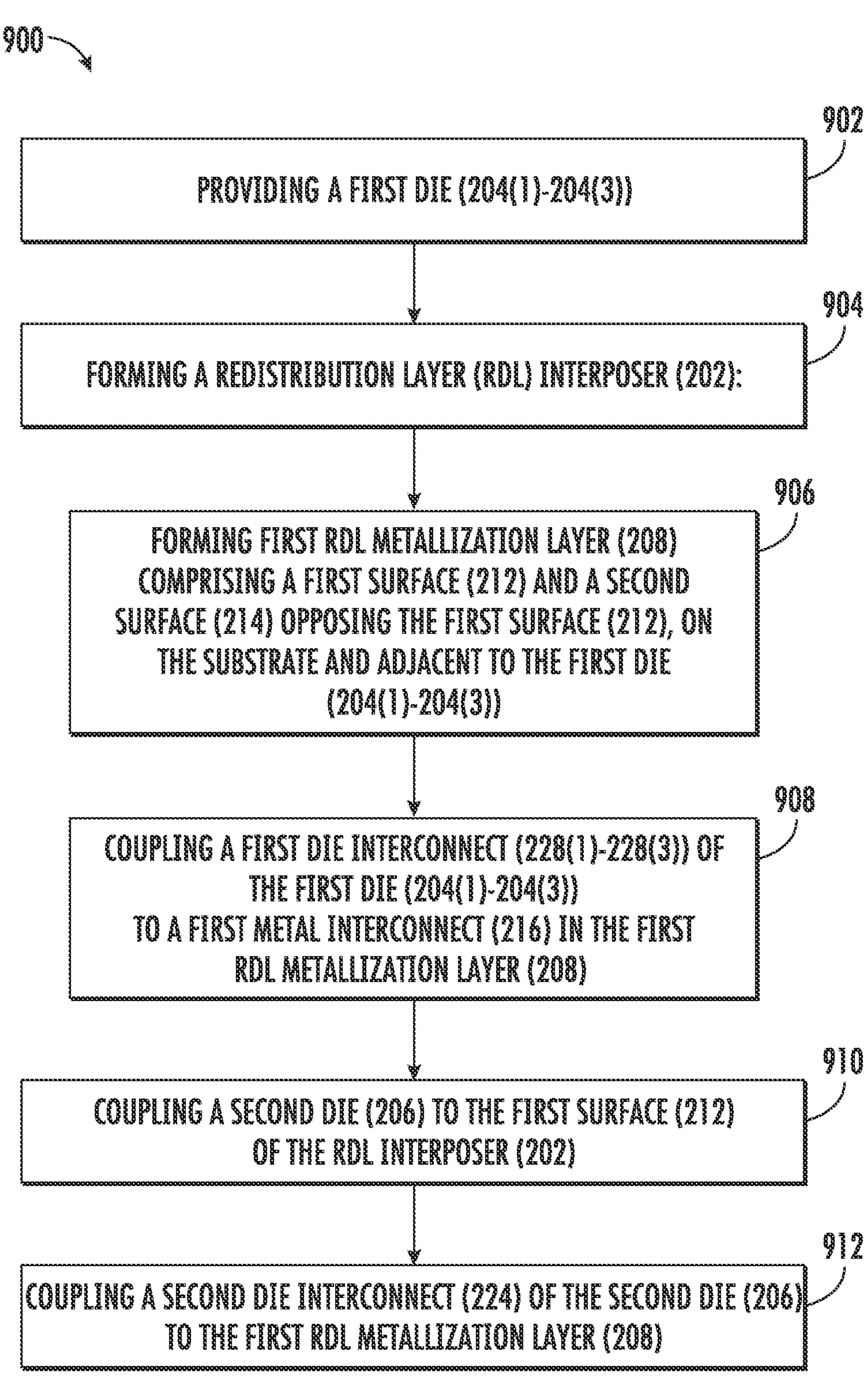
FIG. 9 is a flowchart illustrating an exemplary process of fabricating a 3DIC package that includes an RDL interposer that facilitates an extended die area for 3D stacking of a top die to bottom dies and also includes one or more RDL metallization layers for providing signal routing paths for the top and/or bottom dies.

FIG. 9 is flowchart illustrating an exemplary fabrication process 900 of fabricating a 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8. The fabrication process 900 in FIG. 9 is described with regard to the 3DIC package 200 in FIGS. 2A and 2B. Note however that the fabrication process 900 in FIG. 9 can also be employed to fabricate the other 3DIC packages 300, 400, 500, 600, 700, 800 in FIGS. 3-8 as well.

In this regard, as shown in FIG. 9, a first step in the fabrication process 900 is disposing a first die 204(1)-204(3) on a substrate (block 902 in FIG. 9). A next step in the fabrication process 900 is forming an RDL interposer 202 (block 904 in FIG. 9). Forming the RDL interposer 202 can include the steps of forming first RDL metallization layer 208 comprising a first surface 212 and a second surface 214 opposing the first surface 212, on the substrate and adjacent to the first die 204(1)-204(3) (block 906 in FIG. 9), and coupling a first die interconnect 228(1)-228(3) of the first die 204(1)-204(3) to a first metal interconnect 216 in the first RDL metallization layer 208 (block 908 in FIG. 9). A next step in the fabrication process 900 is coupling a second die 206 coupled to the first surface 212 of the RDL interposer 202 (block 910 in FIG. 9). A next step in the fabrication process 900 is coupling a second die interconnect 224 of the second die 206 to the first RDL metallization layer 208 (block 912 in FIG. 9).

A 3DIC package that includes an RDL interposer that facilitates an extended die area for 3D stacking of a top die(s) to a bottom die(s) and also includes one or more RDL metallization layers for providing signal routing paths for the top and/or bottom dies, including, but not limited, to the 3DIC packages in FIGS. 2A-7, including the 3DIC packages 200, 300, 400, 500, 600, 700, 800 in respective FIGS. 2A-8 can be fabricated in other fabrication processes. For example, FIGS. 10A-10D is a flowchart illustrating an exemplary fabrication process 1000 of fabricating a 3DIC package that includes a top die(s) coupled to an RDL interposer that includes a bottom die(s), and wherein the RDL interposer also provides signal routing paths for the top and/or bottom dies. FIGS. 11A-11H illustrate exemplary fabrication stages 1100A-1100H according to the exemplary 3DIC fabrication process 1000 in FIGS. 10A-10D. The fabrication process 1000 in FIGS. 10A-10D is not limited to fabricating the 3DIC package 200 in FIGS. 2A and 2B.

Figures 10A, 11A, 11B:
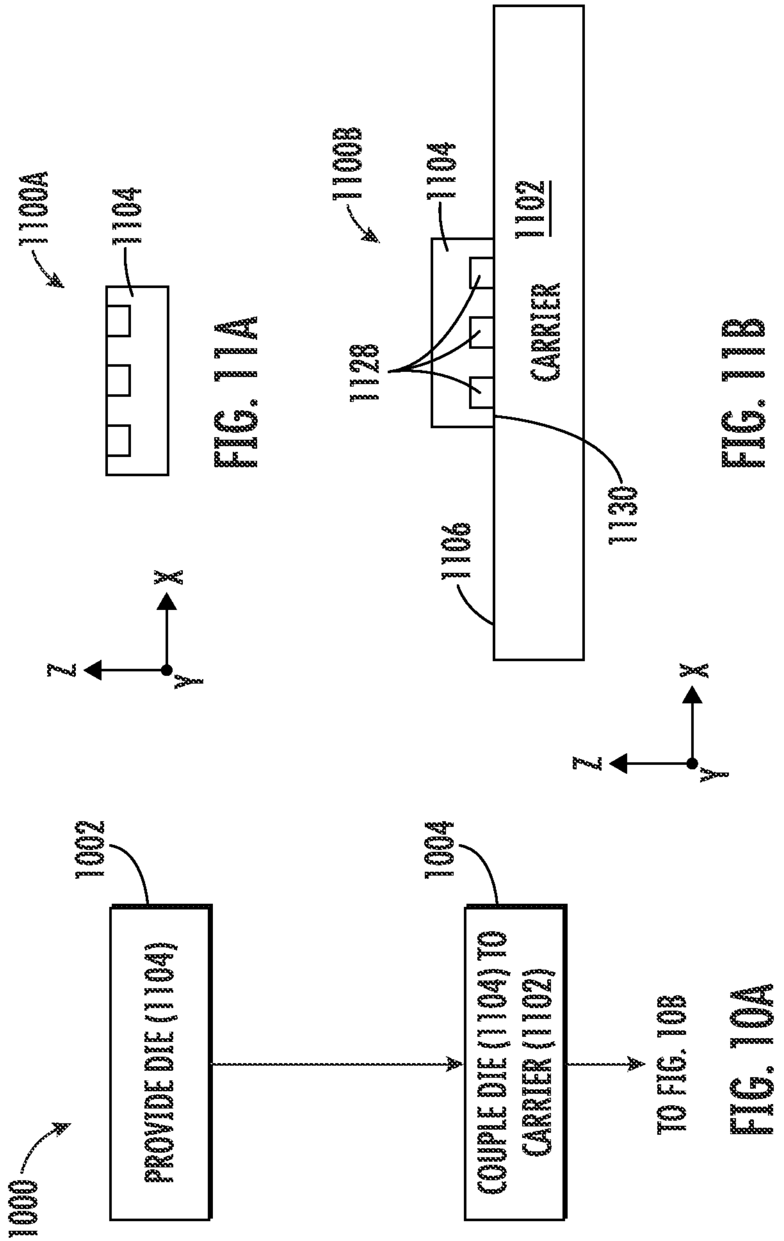
FIGS. 10A-10D is a flowchart illustrating another exemplary fabrication process of fabricating a 3DIC package that includes an RDL interposer that facilitates an extended die area for 3D stacking of a top die to bottom dies and also includes one or more RDL metallization layers for providing signal routing paths for the top and/or bottom dies.
FIGS. 11A-11H illustrate exemplary fabrication stages according to the exemplary 3DIC package fabrication process in FIGS. 10A-10D.

In this regard, as illustrated in the exemplary fabrication stage 1100A in FIG. 11A, a first step in the fabrication process 1000 is to provide a die 1104 that will serve as the bottom die in the eventual 3DIC package (block 1002 in FIG. 10A). The die 1104 can be fabricated as part of a separate fabrication process in which a plurality of the dies 1104 are formed on a semiconductor wafer and then subsequently diced and cleaned to form individual dies 1104. As illustrated in the exemplary fabrication stage 1100B in FIG. 11B, a next step in the fabrication process 1000 is to couple (e.g., mount) the die 1104 to a carrier 1102 (block 1004 in FIG. 10A). This allows the die 1104 to be manipulated by handling the carrier 1102 during the fabrication process 1000. An active face 1130 of the bottom die 1104 is coupled to a first, top surface 1106 of the carrier 1102 such die interconnects 1128 are adjacent to the first, top surface 1106 of the carrier 1102.

Figures 10B, 11C, 11D:
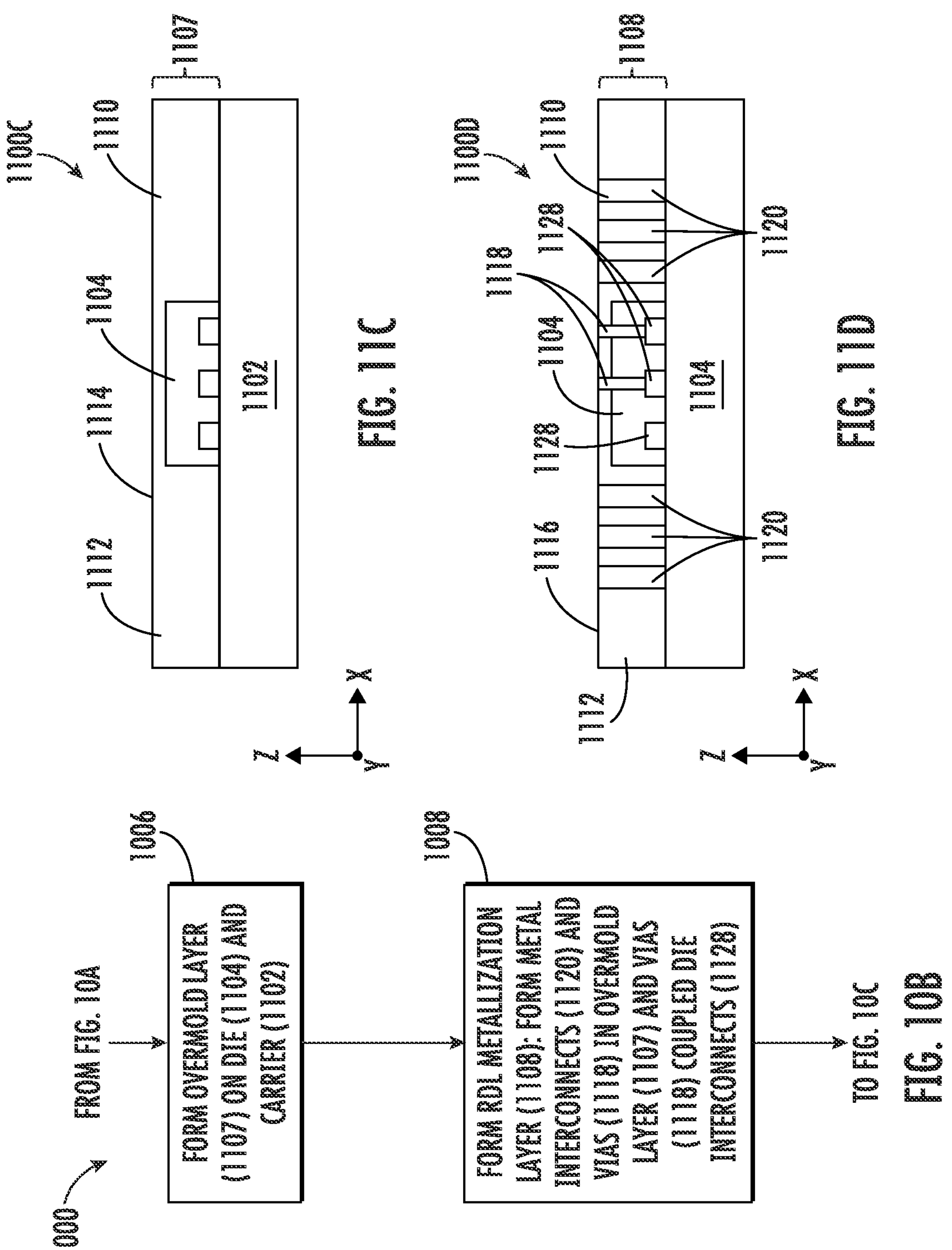

As illustrated in the exemplary fabrication stage 1100C in FIG. 11C, a next step in the fabrication process 1000 is to couple form an overmold layer 1107 over the die 1104 coupled to the carrier 1102 (block 1006 in FIG. 10B). The overmold layer 1108 is formed by disposing an overmolding material 1100 on the die 204 and adjacent to the die 204 on the first surface 1106 of the carrier 1102. The overmold layer 1107 protects and insulates the die 1104. As an example, the overmold layer 1107 may be formed by spinning on or otherwise disposing an oxide layer 1112 on the die 204 and adjacent to the die 204 on the first surface 1106 of the carrier 1102. Then, as illustrated in the exemplary fabrication stage 1100D in FIG. 11D, a next step in the fabrication process 1000 is to form a first RDL metallization layer 1108 from the overmold layer 1107. The first RDL metallization layer 1108 is formed by forming redistributed metal interconnects 1120 in the overmold layer 1107 down to the first surface 1106 of the carrier 1102 and forming the vias 1118 in the overmold layer 1107 and through the die 1104 to be coupled to the die interconnects 1128 (block 1008 in FIG. 10B). As an example, the metal interconnects 1120 are through-mold-vias (TMVs). The metal interconnects 1120 and vias 1118 may be formed by a metal (e.g., copper) plating process wherein the overmold layer 1107 is patterned to form openings where the metal interconnects 1120 and vias 1118 will be formed. A metal material is then disposed in the openings and the remaining residual metal material on a top surface 1114 (FIG. 11C) on the overmold layer 1107 polished and the overmold layer 1107 grinded to remove the residual metal material and expose the metal interconnects 1120 and vias 1118 through a top surface 1116 of the overmold layer 1107 (FIG. 11D).

Figures 10C, 11E, 11F:
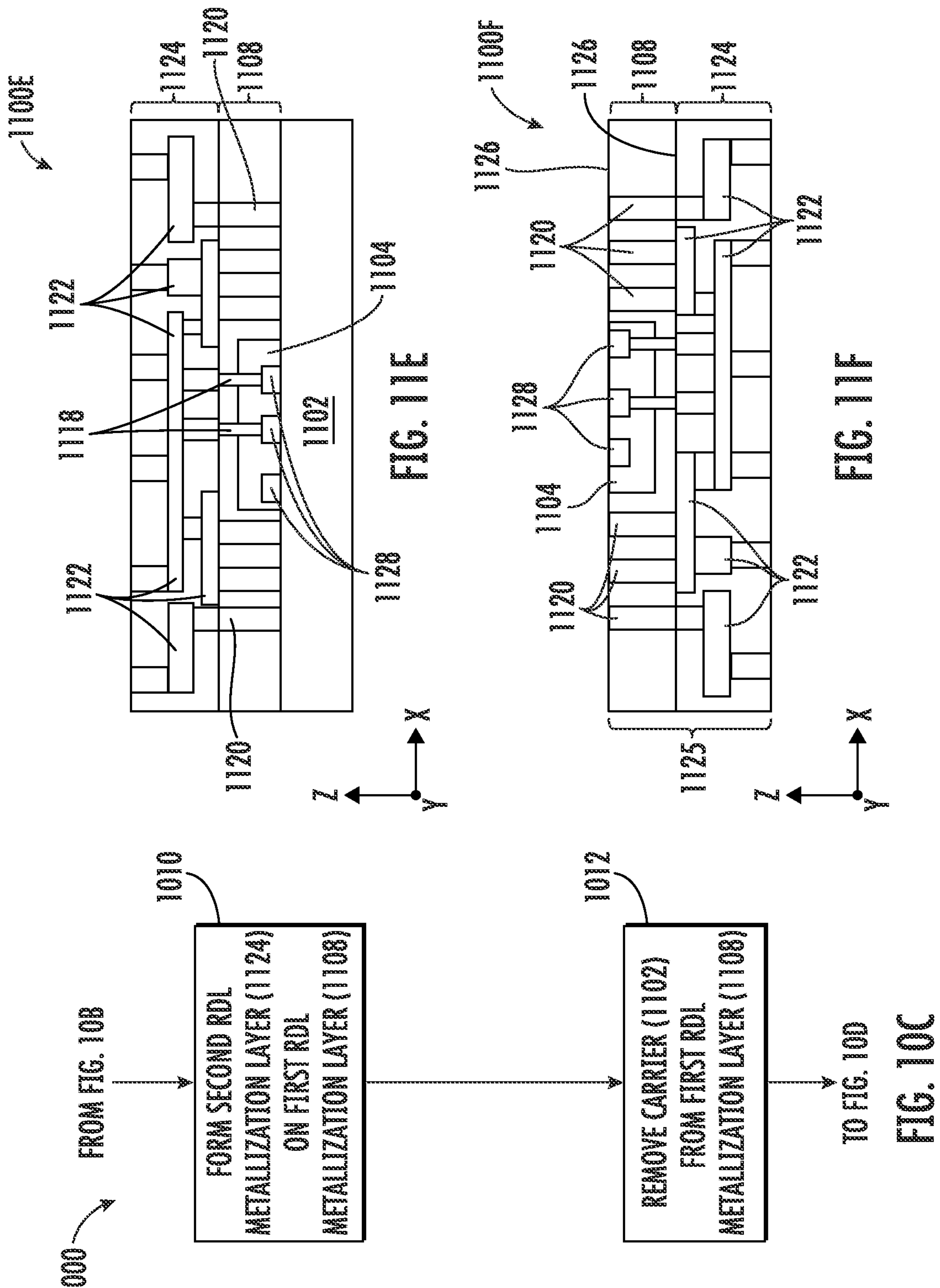

As illustrated in the exemplary fabrication stage 1100E in FIG. 11E, a next step in the fabrication process 1000 is to form another RDL metallization layer 1124 as an interposer substrate on the first RDL metallization layer 1108 in which the bottom die 1104 is disposed (block 1010 in FIG. 10C). Metal interconnects 1122 are formed as part of forming the second RDL metallization layer 1124. The metal interconnects 1122 are coupled to metal interconnects 1120 and the vias 1118 that extend through the first RDL metallization layer 1108. As illustrated in the exemplary fabrication stage 1100F in FIG. 11F, a next step in the fabrication process 1000 is to remove the carrier 1102 from the first RDL metallization layer 1108 (block 1012 in FIG. 10C). The top surface 1126 of the first RDL metallization layer 1108 can thereafter be cleaned. The first and second RDL metallization layers 1108, 1124 for an RDL interposer 1125 in this example.

Figures 10D, 11G, 11H:
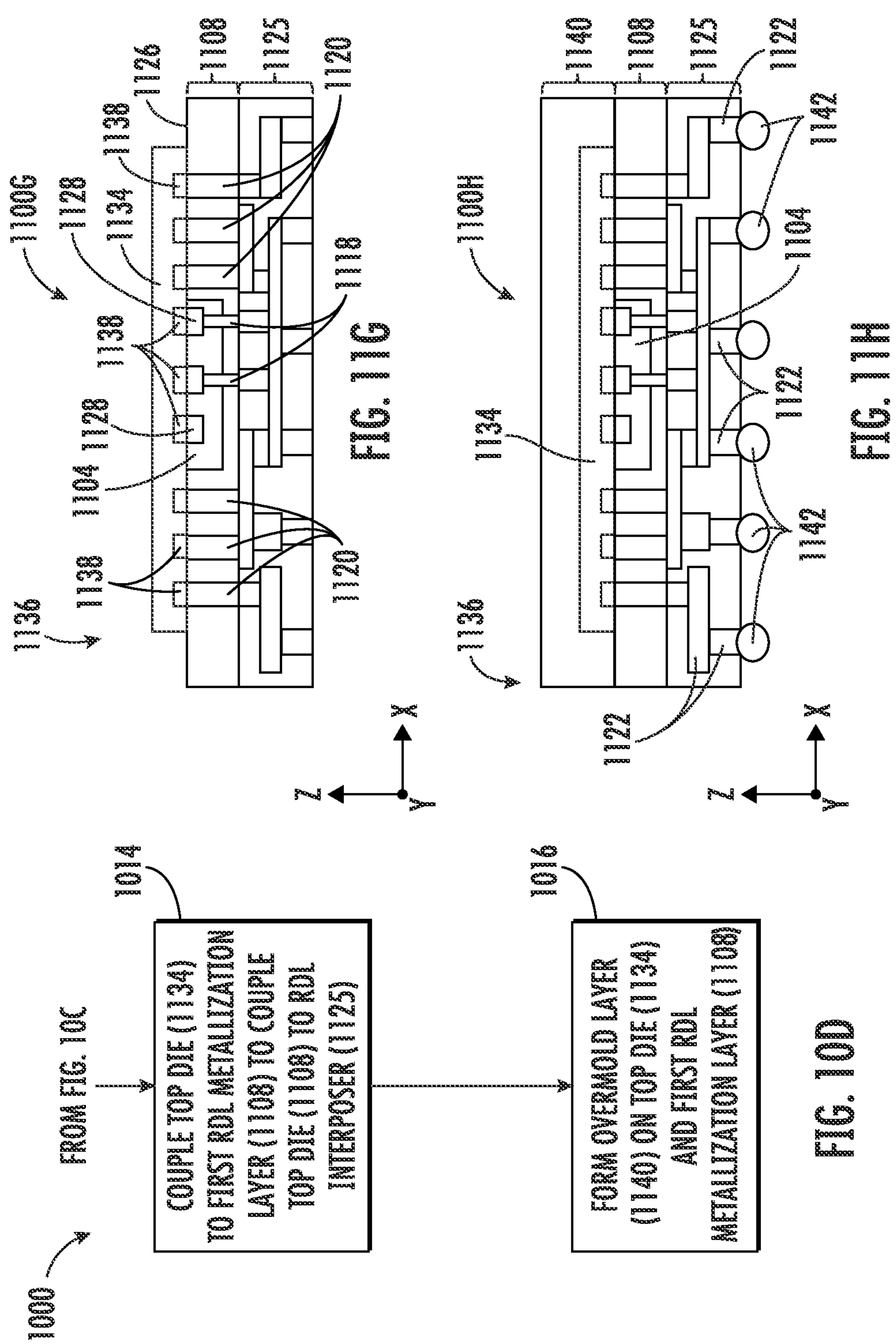

Then, as illustrated in the exemplary fabrication stage 1100G in FIG. 11G, a next step in the fabrication process 1000 is to couple (e.g., bond) a top die 1134 to the bottom die 1104 and the top surface 1126 of the first RDL metallization layer 1108 to form a 3DIC package 1136 (block 1014 in FIG. 10D). Die interconnects 1138 of the top die 1134 are aligned with the exposed surfaces of the metal interconnects 1120 and die interconnects 1128 of the bottom die 1104 to couple the die interconnects 1138 of the top die 1134 to the metal interconnects 1120 and vias 1118 extending through the bottom die 1104. This is a die-to-wafer coupling or bonding process. This die-to-wafer coupling or bonding process provides an electrical coupling between the top die 1134 and the RDL interposer 1125. Then, as illustrated in the exemplary fabrication stage 1100H in FIG. 11H, a next step in the fabrication process 1000 is to form an overmold layer 1140 over the top die 1134 and adjacent to the top die 1134 on the first RDL metallization layer 1108 to form the 3DIC package 1136 (block 1016 in FIG. 10D). External interconnects 1142 are also formed in contact with metal interconnects in the RDL interposer 1125.

A 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8 and 11A-11H, and according to the exemplary fabrication processes in FIGS. 9 and 10A-10D, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
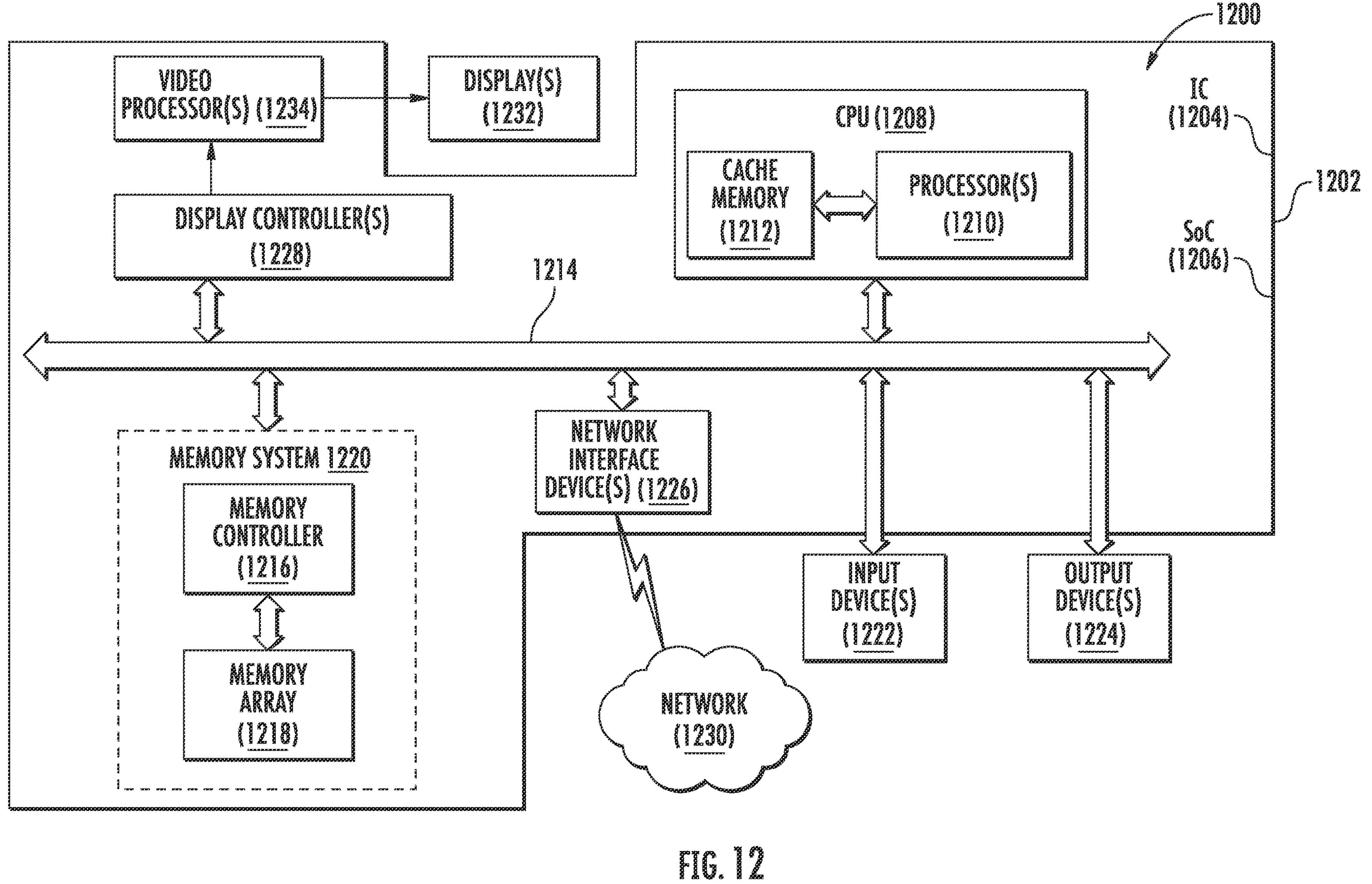
FIG. 12 is a block diagram of an exemplary processor-based system that can include components that can include a 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8 and 11A-11H, and according to the exemplary fabrication processes in FIGS. 9 and 10A-10D.

In this regard, FIG. 12 illustrates an example of a processor-based system 1200. The components of the processor-based system 1200 are ICs 1202. Some or all of the ICs 1202 in the processor-based system 1200 can be provided as a 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8 and 11A-11H, and according to the exemplary fabrication processes in FIGS. 9 and 10A-10D, and according to any aspects disclosed herein. In this example, the processor-based system 1200 may be formed as IC package 1204 and as a system-on-a-chip (SoC) 1206. The processor-based system 1200 includes a CPU 1208 that includes one or more processors 1210, which may also be referred to as CPU cores or processor cores. The CPU 1208 may have cache memory 1212 coupled to the CPU 1208 for rapid access to temporarily stored data. The CPU 1208 is coupled to a system bus 1214 and can intercouple master and slave devices included in the processor-based system 1200. As is well known, the CPU 1208 communicates with these other devices by exchanging address, control, and data information over the system bus 1214. For example, the CPU 1208 can communicate bus transaction requests to a memory controller 1216 as an example of a slave device. Although not illustrated in FIG. 12, multiple system buses 1214 could be provided, wherein each system bus 1214 constitutes a different fabric.

Other master and slave devices can be connected to the system bus 1214. As illustrated in FIG. 12, these devices can include a memory system 1220 that includes the memory controller 1216 and a memory array(s) 1218, one or more input devices 1222, one or more output devices 1224, one or more network interface devices 1226, and one or more display controllers 1228, as examples. Each of the memory system 1220, the one or more input devices 1222, the one or more output devices 1224, the one or more network interface devices 1226, and the one or more display controllers 1228 can be provided in the same or different circuit packages. The input device(s) 1222 can include any type of input device, including, but not limited to, input keys, switches, voice processors, etc. The output device(s) 1224 can include any type of output device, including, but not limited to, audio, video, other visual indicators, etc. The network interface device(s) 1226 can be any device configured to allow exchange of data to and from a network 1230. The network 1230 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1226 can be configured to support any type of communications protocol desired.

The CPU 1208 may also be configured to access the display controller(s) 1228 over the system bus 1214 to control information sent to one or more displays 1232. The display controller(s) 1228 sends information to the display(s) 1232 to be displayed via one or more video processors 1234, which process the information to be displayed into a format suitable for the display(s) 1232. The display controller(s) 1228 and video processor(s) 1234 can be included as IC package 1204 and the same or different circuit packages, and in the same or different circuit packages containing the CPU 1208 as an example. The display(s) 1232 can include any type of display, including, but not limited to, a cathode ray tube (CRT), a liquid crystal display (LCD), a plasma display, a light emitting diode (LED) display, etc.

Figure 13:
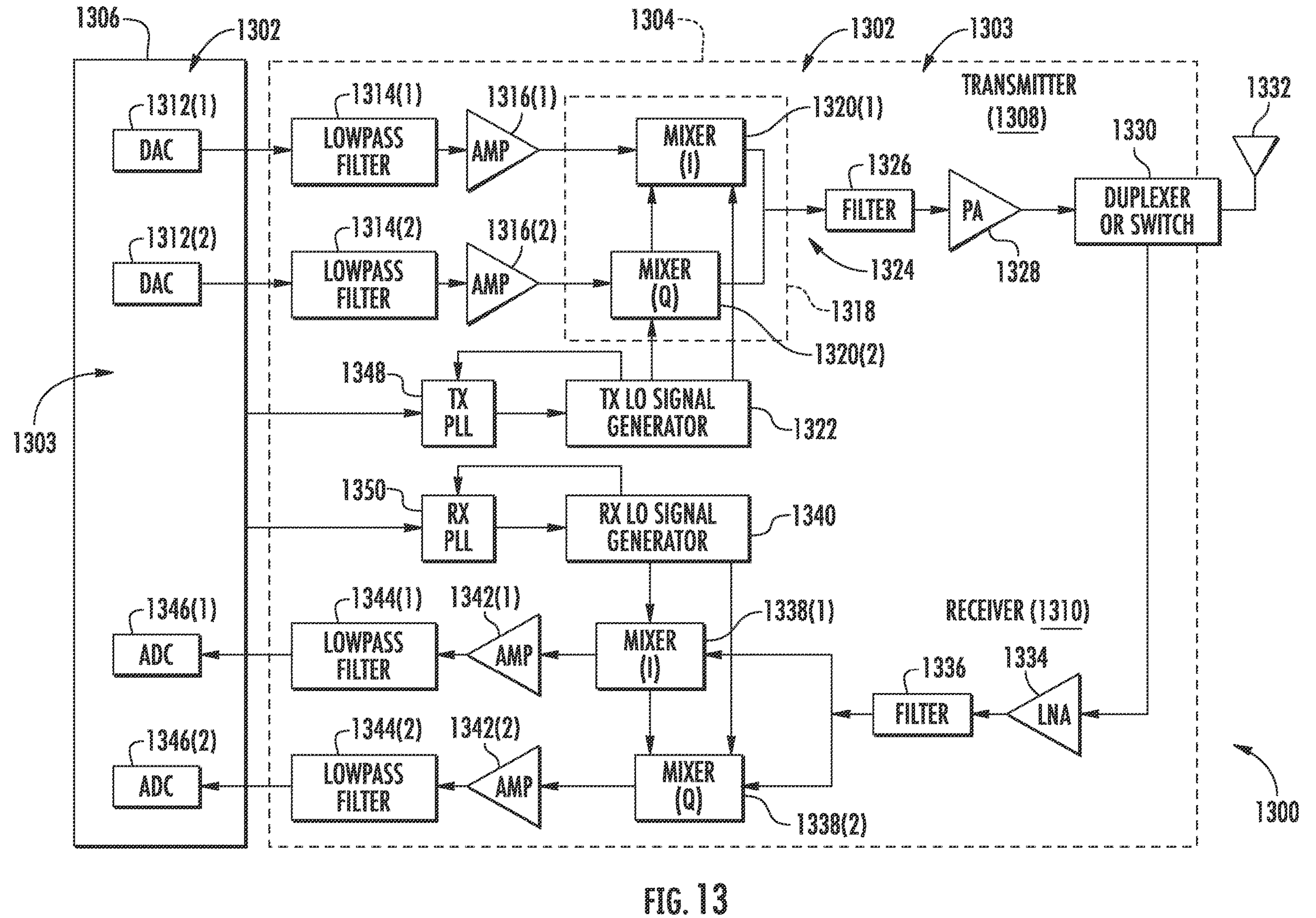
FIG. 13 is a block diagram of an exemplary wireless communications device that includes radio-frequency (RF) components that can include a 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8 and 11A-11H, and according to the exemplary fabrication processes in FIGS. 9 and 10A-10D.

FIG. 13 illustrates an exemplary wireless communications device 1300 that includes radio frequency (RF) components formed from one or more ICs 1302. Any of the ICs 1302 can include a 3DIC package that includes an RDL interposer that facilitates an extended die area for 3D stacking of a top die(s) to bottom die(s) and also includes one or more RDL metallization layers for providing signal routing paths for the top and/or bottom dies, including, but not limited, to the 3DIC packages in FIGS. 2A-8 and 11A-11H, and according to the exemplary fabrication processes in FIGS. 9 and 10A-10D, and according to any aspects disclosed herein. The wireless communications device 1300 may include or be provided in any of the above-referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RFICs, mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMPs) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted by an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by AMPs 1342(1), 1342(2) and further filtered by lowpass filters 1344(1), 1344(2) to obtain I and Q analog input signals, which are provided to the data processor 1306. In this example, the data processor 1306 includes analog-to-digital converters (ADCs) 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Note that the terms "top" and "bottom" as used herein are relative terms. A component being referred to as a "top" component is disposed as shown in the figure in a second, vertical direction above another component referred to as a "bottom" component. However, such is not limiting. In a reverse orientation, a component referred to as a "top" component could be flow another component referred to as a "bottom" component.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
 an interposer, comprising:
  a first surface and a second surface opposing the first surface; and
  one or more RDL metallization layers between the first surface and the second surface;
 a first die disposed in the interposer,
  the first die comprising a first die interconnect coupled to a first metal interconnect in a first RDL metallization layer of the one or more RDL metallization layers; and
 a second die coupled to the first surface of the interposer,
  the second die comprising a second die interconnect coupled to the first RDL metallization layer.

2. The IC package of clause 1, wherein:
 the interposer extends in a first direction;
 the second surface is opposing the first surface in a second direction orthogonal to the first direction; and
 the one or more RDL metallization layers are disposed between the first surface and the second surface in the second direction.

3. The IC package of clause 1 or 2, wherein the first die is adjacent to the first RDL metallization layer.

4. The IC package of clause 1 or 2, wherein:
 the one or more RDL metallization layers further comprises a second RDL metallization layer, and
 the first die further comprises a third die interconnect coupled to a third metal interconnect in the second RDL metallization layer.

5. The IC package of any of clauses 1 to 4, wherein:
 the second die interconnect is coupled to a second metal interconnect in the first RDL metallization layer; and
 the second metal interconnect is redistributed outside to a first area of the first RDL metallization layer outside of a second area of the second die coupled to the first surface of the interposer.

6. The IC package of clause 5, wherein the first metal interconnect is coupled to the second metal interconnect.

7. The IC package of clause 5, wherein:
 the second die shares a first common plane with the first die; and
 the second die interconnect of the second die is coupled to a third die interconnect of the first die.

8. The IC package of any of clauses 1 to 7, wherein:
 the first die comprises a first active face adjacent to the first surface and a third die interconnect exposed from the first active face;
 the second die comprises a second active face adjacent to the first surface, wherein the second die interconnect is exposed from the second active face; and
 the second die interconnect of the second die is bonded to the third die interconnect of the first die.

9. The IC package of any of clauses 1 to 7, wherein:
 the first die comprises a first inactive face adjacent to the first surface and a third die interconnect exposed from the first inactive face;
 the second die comprises a second active face adjacent to the first surface, wherein the second die interconnect is exposed from the second active face; and
 the second die interconnect of the second die is bonded to the third die interconnect of the first die.

10. The IC package of any of clauses 1 to 9, further comprising a first via disposed through the first die;
 wherein the second die interconnect of the second die is coupled to the first via.

11. The IC package of any of clauses 1 to 10, further comprising a first via extending from the first surface of the interposer to the second surface of the interposer;
 wherein the second die interconnect of the second die is coupled to the first via.

12. The IC package of any of clauses 1 to 11, further comprising a third die coupled to a first area on the first surface of the interposer outside a second area of the first die in the interposer,
 wherein the third die comprises a third die interconnect coupled to a second metal interconnect of the first RDL metallization layer.

13. The IC package of clause 1 or 2, further comprising a third die disposed in the first RDL metallization layer,
 the third die comprising a third die interconnect coupled to a second metal interconnect in the first RDL metallization layer.

14. The IC package of clause 13, wherein the third die is not communicatively coupled to the second die.

15. The IC package of any of clauses 1 to 14, further comprising:
 one or more external interconnects coupled to a bottom surface of the interposer, the one or more external interconnects each coupled to one or more second metal interconnects in the first RDL metallization layer; and
 a package substrate coupled to the one or more external interconnects.

16. The IC package of clause 15, wherein the one or more external interconnects comprise one or more ball grid array (BGA) interconnects.

17. The IC package of any of clauses 1 to 16, wherein:
 the second die further comprises an integrated capacitor,
 the second die further comprises a third die interconnect; and
 the third die interconnect is coupled to the integrated capacitor and to a second metal interconnect of the first RDL metallization layer.

18. The IC package of any of clauses 1 to 17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer, a mobile computing device; a wearable computing device; a desktop computer; a personal digital assistant (PDA); a monitor; a computer monitor, a television; a tuner, a radio; a satellite radio; a music player, a digital music player; a portable music player; a digital video player, a video player, a digital video disc (DVD) player; a portable digital video player, an automobile; a vehicle component; avionics systems; a drone; and a multicopter.

19. A method of fabricating an integrated circuit (IC) package, comprising:

forming an interposer, comprising:

forming a first RDL metallization layer adjacent to a first die the first RDL metallization layer comprising a first surface and a second surface opposing the first surface; and coupling a first die interconnect of the first die to a first metal interconnect in the first RDL metallization layer;

coupling a second die to the first surface of the interposer; and coupling a second die interconnect of the second die to the first RDL metallization layer.

20. The method of clause 19, further comprising:

forming a second RDL metallization layer comprising a second metal interconnect; and coupling a third die interconnect of the first die to the second metal interconnect in the second RDL metallization layer.

21. The method of clause 19 or 20, further comprising forming a second metal interconnect in the first RDL metallization layer to a first area of the first RDL metallization layer outside of a second area of the second die coupled to the first surface of the interposer;

wherein coupling the second die interconnect of the second die to the first RDL metallization layer comprises coupling the second die interconnect to the second metal interconnect in the first RDL metallization layer.

22. The method of any of clauses 19 to 21, wherein coupling the second die to the first surface of the interposer comprises bonding a second active face of the second die to the first surface of the first RDL metallization layer and adjacent to a first active face of the first die.

23. The method of any of clauses 19 to 21, wherein coupling the second die to the first surface of the interposer comprises bonding a second active face of the second die to the first surface of the first RDL metallization layer and adjacent to a first inactive face of the first die.

24. The method of any of clauses 19 to 23, further comprising disposing a first via through the first die;

wherein coupling the second die interconnect of the second die to the first RDL metallization layer comprises coupling the second die interconnect of the second die to the first via.

25. The method of any of clauses 19 to 24, further comprising forming a first via extending from the first surface of the interposer to the second surface of the interposer, wherein coupling the second die interconnect of the second die to the first RDL metallization layer comprises coupling the second die interconnect of the second die to the first via.

26. The method of any of clauses 19 to 25, further comprising:

coupling a third die to a first area on the first surface of the interposer outside a second area of the first die in the interposer, and coupling a third die interconnect of third die to a second metal interconnect of the first RDL metallization layer.

27. The method of any of clauses 19 to 26, further comprising:

disposing a third die in the first RDL metallization layer, and coupling a third die interconnect of the third die to a second metal interconnect in the first RDL metallization layer.

28. The method of clause 27, further comprising not communicatively coupling the third die to the second die.

29. The method of any of clauses 19 to 28, further comprising forming an overmold layer on the first surface of the first RDL metallization layer, the overmold layer adjacent to the second die.

What is claimed is:

1. An integrated circuit (IC) package, comprising:

an interposer, comprising:

a first surface and a second surface opposing the first surface; and one or more redistribution layers (RDLs) between the first surface and the second surface, the one or more RDLs comprising:

a first RDL comprising:

a first metal interconnect; and a second metal interconnect;

a first die disposed in the interposer, the first die comprising a first die interconnect embedded in the first die and coupled to the first metal interconnect; and a second die coupled to the first surface of the interposer, the second die comprising a second die interconnect embedded in the second die, wherein the first die interconnect of the first die is directly bonded to the second die interconnect of the second die, coupling the second die interconnect to the first metal interconnect, the second die further comprising:

an outer die interconnect embedded in the second die and coupled to the second metal interconnect, the second metal interconnect coupled to a region of the first RDL laterally offset from a footprint of the second die on the first surface of the interposer.

2. The IC package of claim 1, wherein:

the interposer extends in a first direction;

the second surface is opposing the first surface in a second direction orthogonal to the first direction; and the one or more RDLs are disposed between the first surface and the second surface in the second direction.

3. The IC package of claim 1, wherein the first die is adjacent to the first RDL.

4. The IC package of claim 1, wherein:

the one or more RDLs further comprises a second RDL; and the first die further comprises a third die interconnect coupled to a third metal interconnect in the second RDL.

5. The IC package of claim 1, wherein the first metal interconnect is coupled to the second metal interconnect.

6. The IC package of claim 1, wherein:

the second die shares a first common plane with the first die; and a fifth die interconnect of the second die is bonded to a third die interconnect of the first die.

7. The IC package of claim 1, wherein:

the first die comprises a first active face adjacent to the first surface and a third die interconnect exposed from the first active face;

the second die comprises a second active face adjacent to the first surface, wherein a fifth die interconnect is exposed from the second active face; and the fifth die interconnect of the second die is bonded to the third die interconnect of the first die.

8. The IC package of claim 1, wherein:

the first die comprises a first inactive face adjacent to the first surface and a third die interconnect exposed from the first inactive face;

the second die comprises a second active face adjacent to the first surface, wherein a fifth die interconnect is exposed from the second active face; and the fifth die interconnect of the second die is bonded to the third die interconnect of the first die.

9. The IC package of claim 1, further comprising a first via disposed through the first die;

wherein the second die interconnect of the second die is coupled to the first via.

10. The IC package of claim 1, further comprising;

a third die coupled to the first surface of the interposer and including a sixth die interconnect;

a first via extending from the first surface of the interposer to the second surface of the interposer, wherein the sixth die interconnect of the third die is coupled to the first via.

11. The IC package of claim 1, further comprising a third die coupled to a first area on the first surface of the interposer outside a second area of the first die in the interposer;

wherein the third die comprises a third die interconnect coupled to the second metal interconnect of the first RDL.

12. The IC package of claim 1, further comprising a third die disposed in the first RDL, the third die comprising a seventh die interconnect coupled to the second metal interconnect in the first RDL.

13. The IC package of claim 12, wherein the third die is not communicatively coupled to the second die.

14. The IC package of claim 1, further comprising:

one or more external interconnects coupled to a bottom surface of the interposer, the one or more external interconnects each coupled to one or more second metal interconnects in the first RDL; and a package substrate coupled to the one or more external interconnects.

15. The IC package of claim 14, wherein the one or more external interconnects comprise one or more ball grid array (BGA) interconnects.

16. The IC package of claim 1, wherein:

the second die further comprises an integrated capacitor;

the second die further comprises a third die interconnect; and the third die interconnect is coupled to the integrated capacitor and to the second metal interconnect of the first RDL.

17. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *